(12) United States Patent
Pappalardo et al.

(10) Patent No.: US 9,378,077 B2
(45) Date of Patent: Jun. 28, 2016

(54) SYSTEM FOR DETECTING OPERATING ERRORS IN INTEGRATED CIRCUITS

(75) Inventors: Francesco Pappalardo, Catania (IT); Giuseppe Notarangelo, Catania (IT); Elio Guidetti, Como (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 538 days.

(21) Appl. No.: 12/850,056

(22) Filed: Aug. 4, 2010

(65) Prior Publication Data

US 2011/0060975 A1 Mar. 10, 2011

(30) Foreign Application Priority Data

Aug. 7, 2009 (IT) ................ TO2009A0629

(51) Int. Cl.
*G06F 11/00* (2006.01)
*G06F 11/07* (2006.01)
*G06F 11/16* (2006.01)
*H03K 19/007* (2006.01)

(52) U.S. Cl.
CPC ........ *G06F 11/0751* (2013.01); *G06F 11/1608* (2013.01); *G06F 11/1629* (2013.01); *H03K 19/007* (2013.01)

(58) Field of Classification Search
None
See application file for complete search history.

(56) References Cited

U.S. PATENT DOCUMENTS

| 5,802,266 | A | 9/1998 | Kanekawa et al. | |
|---|---|---|---|---|
| 8,466,727 | B2 | 6/2013 | Bancel et al. | |
| 2001/0034854 | A1 | 10/2001 | Mukherjee | |
| 2004/0030953 | A1 | 2/2004 | Sun et al. | |
| 2005/0246613 | A1* | 11/2005 | Blaauw et al. | 714/763 |
| 2006/0119410 | A1 | 6/2006 | Carlson | |
| 2006/0184852 | A1* | 8/2006 | Chu et al. | 714/746 |
| 2006/0220716 | A1* | 10/2006 | Nicolaidis | 327/199 |
| 2007/0033448 | A1* | 2/2007 | Waschura et al. | 714/704 |

FOREIGN PATENT DOCUMENTS

EP 2149886 B1 6/2012

OTHER PUBLICATIONS

IT Written Opinion, Mar. 8, 2010, IT Application No. TO20090623, pp. 1-8.
PCT International Publication, Sep. 30, 2004, International Publication No. WO 2004/084070 A1, pp. 1-69.
Killpack, K., et al., "Case Study on Speed Failure Causes in a Microprocessor", IEEE Design & Test of Computers, IEEE Service Center, NY, NY, US., vol. 25, No. 3, May 1, 2008. pp. 224-230.K.
Ernst, D. et al., "Razor: A Low-Power Pipeline based on Circuit-Level Timing Speculation", 36th International Symposium on Microarchitecture, IEEE, 2003. pp. 1-12.
(Continued)

*Primary Examiner* — M. Mujtaba K Chaudry
(74) *Attorney, Agent, or Firm* — Allen, Dyer, Doppelt, Milbrath & Gilchrist, P.A.

(57) ABSTRACT

Errors induced by noise pulses in digital electronic circuits clocked with a clock signal are detected by providing at least one additional clock signal offset in time with respect to the clock signal by a given interval, and performing for at least one component of the circuit a comparison of correspondence between two versions of one and the same signal. The comparison is clocked by the additional clock signal and the absence of correspondence between the two versions of said signal identifies an error induced in the circuit by a noise pulse.

19 Claims, 16 Drawing Sheets

(56) References Cited

OTHER PUBLICATIONS

M. Hartmann and P.C. Haddow, "Evolution of fault-tolerant and noise-robust digital designs", IEE Proc.—Comput. Digit. Tech., vol. 151, No. 4, Jul. 2004, pp. 287-294.

F.L. Yang and Resve A. Saleh, "Simulation and Analysis of Transient Faults in Digital Circuits", IEEE Journal of Solid-State Circuits, vol. 27, No. 3, Mar. 1992, pp. 258-264.

D. Blaauw et al.,"Razor II. In Situ Error Detection and Correction for PVT and SER Tolerance", 2008 IEE International Solid-State Circuit Conference, ISSCC 2008/ Session 22/ Variation Compensation & Measurement/22.1, pp. 400-401, 622.

S. Lee et al., "Reducing Pipeline Energy Demands with Local DVS and Dynamic Retiming", Proceedings of the 2004 International Symposium on Low Power Electronics and Design (ISLPED'04), Aug. 9-11, 2004, Newport Beach, California, USA, pp. 319-324.

Ickes et al.—A 10-pJ/instructions, 4-MIPS Micropower DSP for Sensor Applications, IEEE Asian Solid-State circuits Conference, Nov. 3-5, 2008, pp. 289-292.

Iyer et al.—A Statistical Load Dependency Model for CPU Errors at SLAC, IEEE Proceedings of FTCS-25, vol. III, 1982, pp. 373-382.

\* cited by examiner a)
b)

SYSTEM FOR DETECTING OPERATING ERRORS IN INTEGRATED CIRCUITS

RELATED APPLICATION

The present application claims priority of Italian Patent Application No. TO2009A000629 filed Aug. 7, 2009, which is incorporated herein in its entirety by this reference.

FIELD OF THE INVENTION

The present invention relates to techniques for detecting operating errors in electronic systems, sometimes referred to fault tolerance techniques. The present application has particular utility in correcting operating errors due to noise pulses in electronic systems.

BACKGROUND

Various fields of application of integrated circuits (e.g., applications in biomedical, automotive and avionics sectors) require the corresponding systems to operate in "zero failure" conditions, i.e., prove practically immune in regard to disturbance, such as, for example, impulsive noise due to external radiation (cosmic rays, microwaves, ultraviolet rays, electromagnetic fields of various nature, etc.) and to phenomena of internal migration of energy and of coupling between conductors (said phenomena being particularly important in the case of submicrometric technologies and for nanoscale design). One of the possible manifestations of "fault tolerance" is the capacity for a system to respond "gracefully" to an unexpected failure both of a hardware nature and of a software nature.

There exist, of course, various levels of fault tolerance. Among these the lowest is the capacity for continuing to function in the case of lack of supply. Various computer systems with fault-tolerance characteristics operate according to a redundancy scheme: each operation is performed by two or more duplicated systems in such a way that, if a system is affected by a failure, the other system or systems can stand in to ensure continuity of proper operation. Said computers of a fault-tolerant type always present a certain level of duplication of hardware so that, if a component is affected by failure, at least one duplicated component is able to stand in immediately without having to deactivate the computer. Computers with a high degree of fault tolerance can consequently be rather costly and complex to design.

In applications such as control of nuclear power stations or piloting of aircraft (applications in which safety is crucial and absolute reliability is an indispensable need) the choice of solutions of this nature is in effect imperative. In other applications, it is instead possible to think of intermediate-level solutions, where, in the case of a failure of some component part, the system is able to continue to function, possibly with a reduced level of performance, without completely ceasing to function. Solutions of this type are used in particular for computer-based systems for which, in the presence of some failure, a continuation of operation is acceptable albeit with a reduced throughput and/or an increase in the response times: in other words, in the presence of hardware and/or software problems, the system is not completely shut down, but a certain level of operation is in any case preserved. It is on this basis that certain systems operate, for example, systems for application in the automotive sector, which are designed to allow a motor vehicle to continue to move, perhaps at a lower speed, if one of the tires is punctured. In said general framework, the concept of fault tolerance nowadays assumes a particular importance in sectors such as the biomedical sector or the automotive sector on the basis of a paradigm that fundamentally envisages the presence of a certain degree of redundancy (i.e., the presence of more resources than are strictly necessary) in such a way as to allow a redundant resource to stand in for a resource affected by a failure. In the specific case of electronic circuits such as integrated circuits, fault-tolerance techniques are implemented mainly by replicating the system resources at least at critical nodes of a calculation chain and, at times, by replicating the entire structure, giving rise in practice to a parallel calculation/processing structure.

By way of example it is possible to cite solutions like the one described in US2001/0034854 A1, which illustrates a processor that is able to execute simultaneously the same instruction set on two separate threads so as to produce an adequate level of fault tolerance. One thread is processed before the other one allocates the readings not subjected to caching in a reading queue. The thread that operates with delay performs the same operation, and then the two readings not yet cached are compared. If there is coincidence, one of the readings passes to the main memory of the system; otherwise, the presence of a failure is identified and a recovery procedure starts up.

The solution described in U.S. Publication No. US2004/0030953 A1 functions instead, by storing a minimum code set in a protected memory in such a way that—if the programming process in the framework of the circuit is subject to fault—the instruction set can be executed again starting from the protected field of the memory. In one embodiment, a series of multiplexers is provided for switching selectively between a normal code sequence and the protected one. A watchdog timer monitors the programming process within the circuit for determining possible faults in the development of processing of the instructions.

These solutions fit within the concept (which is very costly but, at least in principle, altogether safe) that is at times referred to as Evolvable HardWare (EHW). This is basically a design criterion of digital circuits inspired by concepts drawn from the biological sciences, which envisages a hardware organism with a number of layers or levels in which each cell contains the complete genotype of the circuit (see in this regard the article by M. Hartmann et al. "Evolution of fault-tolerant and noise-robust digital designs", IEE Proc.-Comput. Digit. Tech., vol. 151, No. 4, July 2004).

In the application to electronic circuits, such as for example integrated circuits, fault-tolerance techniques aim at taking into account the noise of an impulsive type that afflict said circuits, in particular with the capacity of propagating through the circuit itself. One of the most widely known models of said impulsive noise (in particular, as regards integrated circuits or ICs) is represented by alpha particles. In effect, it has been shown that approximately 85% of the faults that can be found in a system can be caused by transient faults, with the alpha particles at the basis of the transients that create the biggest trouble. The transient failures or faults are temporary ones (i.e., non-permanent ones) that are likely to arise in a circuit during its operation on account of the effect of various internal and external sources of noise. These failures or faults are intrinsically different from the failures or faults introduced in the course of production of a circuit (which generally prevent operation of the circuit in a stable way): the transient failures or faults act only for a short interval of time in the framework of a circuit that for the rest would function normally. In particular, in digital systems these failures or faults can be produced by internal sources of noise, such as for example supply transients, phenomena of capacitive and inductive diaphony, or else by external sources of noise, such as for example the effect of particles or cosmic rays (such as precisely alpha particles).

The study of said phenomena of disturbance entails the use of mathematical models, such as for example a double exponential function. For a treatment in this regard reference may be made, for example, to the article by F. L. Yang et al.: "Simulation and Analysis of Transient Faults in Digital Circuits", IEE Journal of Solid-State Circuits, vol. 27, No. 3, 1992.

Even though an alpha particle generates a pulse of very short duration, the corresponding effect can be to a certain extent amplified by the phenomena of delay of the internal gates of the circuit. Consequently, an effect of noise that initially would not be particularly harmful for operation of a complex digital circuit can become an important source of disturbance after being propagated through the logic gates of the circuit (for example NAND, NOR gates, or logic inverters).

For completeness of treatment, it may again be mentioned that there are in themselves known circuits that envisage detection of the delays of propagation of signals within integrated circuits with feedback function of various nature. In this regard, reference may be made to the following documents:

D. Ernst et al.: "Razor: A Low-Power Pipeline Based on Circuit-Level Timing Speculation", Proceedings of the 36th International Symposium on Microarchitecture (MICRO-36'03);

D. Blaauwl et al.: "Razor II. In Situ Error Detection and Correction for PVT and SER Tolerance", 2008 IEE International Solid-State Circuit Conference;

S. Lee et al.: "Reducing Pipeline Energy Demands with Local DVS and Dynamic Retiming", *ISLPED '04*, Aug. 9-11, 2004, Newport Beach, Calif., USA.

SUMMARY OF THE INVENTION

The inventors have noted that, notwithstanding the efforts so far made in the matter, there is still felt the need for devices that can be used in the framework of fault-tolerance techniques, in particular in relation to circuits such as integrated circuits, that will be able to satisfy the following requirements:

rendering robust, in regard to noise, the parts of the integrated circuit as regards both parts of a combinatorial type and sequential blocks;

allowing a ports verification of the integrity of the circuit, avoiding the need for complete duplication thereof;

performing an intervention of a flexible type by implementing the fault-tolerance function possibly only on certain critical parts of a system;

varying the degree of refinement or granularity of the intervention according to the needs of the specific application;

recognizing and recovering or remedying the error, if need be with a reset of the "machine";

adapting the criteria of interventions to the specific needs of given critical areas of an integrated circuit; and guaranteeing the control and recovery at a register level.

An object of the present invention is to provide an answer to the above needs.

According to the invention, the above object is achieved thanks to a device having the characteristics recalled specifically in the ensuing claims. The claims form an integral part of the technical teaching provided herein in relation to the invention.

Various embodiments provide an innovative circuit that is able to detect an unexpected hardware failure or fault due to noise pulses in any integrated-circuit device.

Various embodiments implement a flexible hardware mechanism that is able to detect the granularity of the delay due to the error according to the requirements in terms of level of reliability of the system.

Various embodiments can be implemented on integrated-circuit products that may in turn be inserted in devices/systems for which an operation of a zero-failure type is required (for example, in the biomedical sector, in the automotive sector or in avionics applications).

Various embodiments are able to detect the error and restore the "machine" or else detect and remedy the error.

Various embodiments enable avoidance of the need to perform the same operation two or more times with the possibility of increasing the operating clock time according to the granularity of the desired control action.

Various embodiments lend themselves to being implemented with different hardware resources and with different requirements in terms of timing.

Various embodiments envisage a possible application to an architecture of a pipeline type (for example, a REISC—Reduced Energy Instruction Set Computer—architecture), for example, in the form of a 16-bit processor with hardware support for dimensions of data on 8/16/20/32 bits with a variable length of instructions on 16 bits, for example for secure applications with low power absorption (the so-called "ultra-low power" applications).

Various embodiments present the main advantage linked to the possibility of varying the granularity of the action of error detection, without any circuit modifications.

Various embodiments enable detection of any type of error (for example, even double or multiple errors).

Various embodiments referring to a structure of a pipeline type enable extension of fault control both to the flip-flops of the pipeline and to the combinatorial circuits of the pipeline itself.

In various embodiments, to render the control complete, a parity check is introduced in the registers of the register file and in the memory.

In various embodiments, the hardware mechanism is able to detect the error and recover it. The action of recovery of the error may entail mere resetting of the circuit, re-scheduling of the operation (simple solution), starting again from a known point, or else may entail intervention of further control blocks (more complex solution) or else, in the case where the circuit has a path of a pipeline type, simply stalling the pipeline for one clock cycle.

Various embodiments are able to achieve the advantages outlined above without any appreciable increase in the total area of the system, enabling in any case preservation of the performance in the presence of an error, preventing the operating clock period from increasing according to the level of granularity required, whereas other (simpler) embodiments enable preservation of the performance in the presence of an error but with the clock period that increases according to the required level of granularity.

Various embodiments enable detection of errors induced by noise pulses in digital electronic circuits clocked with a (first) clock signal by providing at least one further clock signal offset in time by a given interval ($\tau$) with respect to the first clock signal; there is consequently performed, for at least one component of the circuit, a comparison of correspondence (for example of equality) between two versions of one and the same signal; the comparison is clocked by the further clock signal and the absence of correspondence between the two versions of the signal (which ideally refer to two different instants in time, separated by the aforesaid interval τ, and not to the same instant) identifies an error induced in said digital electronic circuit by a delay or noise pulse, with the possibility of varying the "granularity" (i.e., the resolution of the action of detection) by varying the duration of the interval τ.

BRIEF DESCRIPTION OF THE DRAWINGS

The invention will now be described, purely by way of non-limiting example, with reference to the annexed plates of drawings, wherein.

DETAILED DESCRIPTION OF PREFERRED EMBODIMENTS

Illustrated in the ensuing description are various specific details aimed at providing an in-depth understanding of the embodiments. The embodiments may be implemented without one or more of the specific details, or with other methods, components, materials, etc. In other cases, known structures, materials or operations are not shown or described in detail so that various aspects of the embodiments will not be obscured.

The reference to "one embodiment" in the framework of this description is meant to indicate that a particular configuration, structure, or characteristic described in relation to the embodiment is included in at least one embodiment. Hence, phrases such as "in one embodiment", that may be present in various points of the present description, do not necessarily refer to one and the same embodiment. Furthermore, particular conformations, structures, or characteristics can be adequately combined in one or more embodiments.

The references used herein are provided merely for reasons of convenience and hence do not define the sphere of protection or scope of the embodiments.

Figure 1:
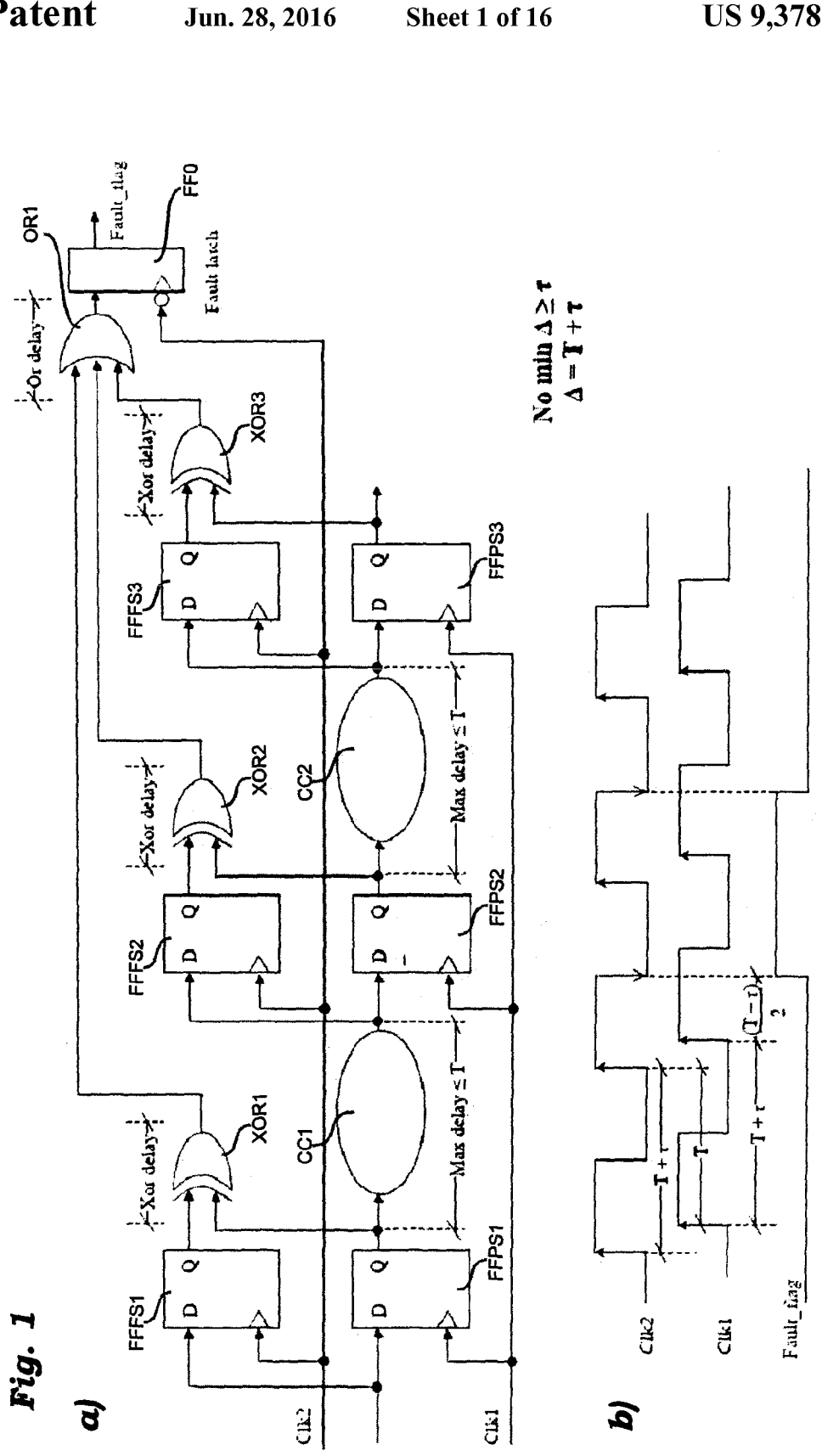
FIGS. 1 to 9 each comprise a first part, designated by a), representing a block diagram of a circuit according to one embodiment and a second part, identified by b), constituted by a chronogram representing the waveform of some signals present in the corresponding circuit.

A good deal of the circuit diagrams illustrated in the annexed drawings refer to the general layout presented for the first time in part a) of FIG. 1.

In the exemplary embodiments considered, this is a structure substantially identifiable as a three-stages pipeline including flip-flops FFPS1, FFPS2, and FFPS3 with a generic combinatorial network or circuit CC1 comprised between the stage FFPS1 and the stage FFPS2 and a combinatorial network or circuit CC2 (that is the same as or different from CC1) comprised between the stage FFPS2 and the stage FFPS3.

The nature of the networks or circuits CC1 and CC2 may be any whatsoever. As far as the present description is concerned, it will be assumed simply that said networks or devices give rise to a propagation delay of the signal through them which has a maximum value equal to T.

The chain or pipeline of flip-flops described is clocked by a first clock signal designated by Clk1.

Persons skilled in the sector will appreciate that the model of pipeline flip-flop cascade illustrated herein can be considered as representing operation of any critical part of a generic integrated circuit, which presents a propagation delay of the signals within it and is likely to be affected by phenomena of external noise, such as for example the alpha particles referred to previously.

Present then in some of the circuit diagrams of the annexed drawings is an "error" pipeline, which replicates, according to a criterion of (complete or incomplete) specularity, the main pipeline already described previously.

In particular, in the case of FIG. 1a) present in the error pipeline are three stages FFFS1, FFFS2, and FFFS3, clocked by a clock signal Clk2 having the characteristics described more fully hereinafter.

For the rest, the diagram of FIG. 1 (as well as the homologous diagrams of the other figures based upon the same principle) envisages that the output of each stage FFPS1, FFPS2 or FFPS3 of the main pipeline is subject to a correspondence check with the output of the homologous stage FFFS1, FFFS2 or FFFS3 of the error pipeline.

In the diagram of FIG. 1 (and in the homologous diagrams that are based upon the same arrangement), the aforesaid correspondence check is performed by three XOR gates, designated, respectively, by XOR1, XOR2 and XOR3, which receive on their inputs, respectively, the outputs of the stages FFPS1 and FFFS1, the outputs of the stages FFPS2 and FFFS2, and again the outputs of the stages FFPS3 and FFFS3.

The outputs of the gates XOR1, XOR2 and XOR3 are then fed to the inputs of an OR (logic sum) gate, designated by OR1, the output of which drives an output flip-flop FFO, operation of which is clocked by the clock signal Clk2.

It will be assumed that both the XOR gates XOR1, XOR2 and XOR3 and the gate OR1 present respective values of propagation delay (XOR delay and OR delay). For reasons of simplicity, in what follows it will be assumed that the three XOR delay values are the same as one another.

It will on the other hand be appreciated that the gates XOR1, XOR2 and XOR3 are to be understood as generically representing any solution that can compare the behavior of the stages of the main pipeline FFPS1, FFPS2 and FFPS3 with the behavior of the states of the error pipeline FFFS1, FFFS2 and FFFS3. Recourse to an XOR gate represents a particularly simple solution. Equivalent solutions may be readily drawn from the techniques of the branch on the basis of current experiments.

Once again, the basic arrangement represented in the diagram of part a) of FIG. 1 is substantially reproduced in various other circuit diagrams that appear in other figures. Consequently, the description of the basic scheme of FIG. 1 will not be re-proposed when we refer to said other embodiments, it being on the other hand clear that specific detailed solutions represented with reference to any one of the circuit diagrams of the annexed drawings can be freely applied, to the extent in which the transposition is technically possible, to any one of the other embodiments.

To return to the example of FIG. 1a), as long as the outputs of each stage of the main pipeline and of the homologous stage of the error pipeline coincide with one another, the output of the XOR logic gate that carries out the check remains at zero, causing the output of the gate OR1 to remain at zero.

In the presence of a difference, the output of the XOR gate that has detected the difference passes to "1", bringing about the corresponding passage to "1" of the output of the gate OR1. The output of the gate OR1 is latched in the flip-flop FFO. The flip-flop FFO is clocked by the falling edge of the clock Clk2 so as to bring about, in the presence of a possible error, the emission of a signal (fault_flag) that can be used, for example, to restore the "machine" (i.e., the circuit considered herein).

It will be once again appreciated that said mechanism may be applied in general to an integrated circuit of any nature.

In particular, it may be imagined that T represents the clock period of the circuit in the case where there is no application of the fault-tolerance technique (it will again be recalled that, for reasons of simplicity of illustration, it has been assumed that the maximum delay of the combinatorial-circuit networks CC1 and CC2 is in any case shorter than or at the most equal to T).

The embodiment considered herein envisages that the period of each of the clock signals Clk1 and Clk2 corresponds to a value T+τ, where the value τ represents the level of granularity of the action of error detection conducted herein. In the embodiment here considered it is envisaged that the temporal distance between each rising edge of the clock Clk1 and the subsequent rising edge of the clock Clk2 is in any case equal to T. In this way, each rising edge of the clock Clk2 precedes the immediately subsequent rising edge of the clock Clk1 by an amount equal to τ, and again each rising edge of the clock signal Clk1 precedes the immediately subsequent falling edge of the clock signal Clk2 by an interval equal to $(T-\tau)/2$.

In said conditions, the output data of each combinatorial-network circuit CC1, CC2 is in effect stored in the pipeline (it will be noted in particular that the outputs of the network circuits CC1 and CC2 are fed not only to the input of the stages FFPS2 and FFPS3, respectively, but also to the inputs of the stages FFFS2 and FFFS3, respectively) in two different instants of time separated from one another—as a result of the different timing of the flip-flops of the main pipeline and of the error pipeline—by a delay τ. The desired phase offset between the signals Clk1 and Clk2 can be obtained by intervening—according to known criteria—on the sources of generation of the clock signals (not illustrated but of a known type) and possibly external to the circuit represented in the figures.

In this way, each combinatorial-network circuit CC1, CC2 does not have time to present a new output in the time interval τ (in so far as it is assumed that the minimum value of T is always in any case greater, and greater than τ). A possible error flag due to a noise pulse is latched on the falling edge of the clock signal Clk2. It will be appreciated in fact that, in the conditions outlined previously, the delay between the rising edge of the clock Clk1 and the subsequent falling edge of the clock Clk2 is longer than or at the most equal to the delay introduced by the path formed by the XOR gates and by the gate OR1. This condition is obtained if the propagation delay through the XOR gates and the gate OR1 is less than $(T-\tau)/2$.

It will be appreciated that, with the solution described, it is possible to recognize any fault of reliability in real time (and hence in a dynamic way), restarting the machine through the error signal Fault_flag at output from the flip-flop FFO (for example, using the reset circuit of a watchdog block).

The solution illustrated in FIG. 1 envisages a complete duplication of the registers (i.e., of the flip-flops of the registers). On the other hand—as will be seen more clearly in what follows—the duplication can be even just partial, and be limited only to the parts considered critical for operation of the circuit.

In the example considered here, the two clock signals Clk1 and Clk2 used for timing the operation of the "main" circuit and of the "error" circuit are, so to speak, "slowed down" (i.e., made to work at a lower frequency), passing from the nominal period T to a period the duration of which is incremented to T+τ where τ represents the granularity of the error-detection function. The value τ can reach a value equal, for example, to T, in which case there is a timing period equal to 2T, i.e., twice the value of the original clock period. In the case of a pipeline structure, this solution affords the advantage of providing the fault-tolerance control, merely on the output stage (i.e., the right-back stage) so as to reduce the increase of area on the circuit.

The outputs of the homologous flip-flops are compared (in the example illustrated, via the gates XOR1, XOR2 and XOR3) when the corresponding output data are stable.

The inventors have been able to note that, in the presence of certain circuit schemes (it is recalled once again that the pipeline structure considered herein in general represents the structure of any integrated circuit that can be represented with the same model), there may arise problems at the level of latching of the data on the falling edge of the clock signal Clk2.

Figure 2:
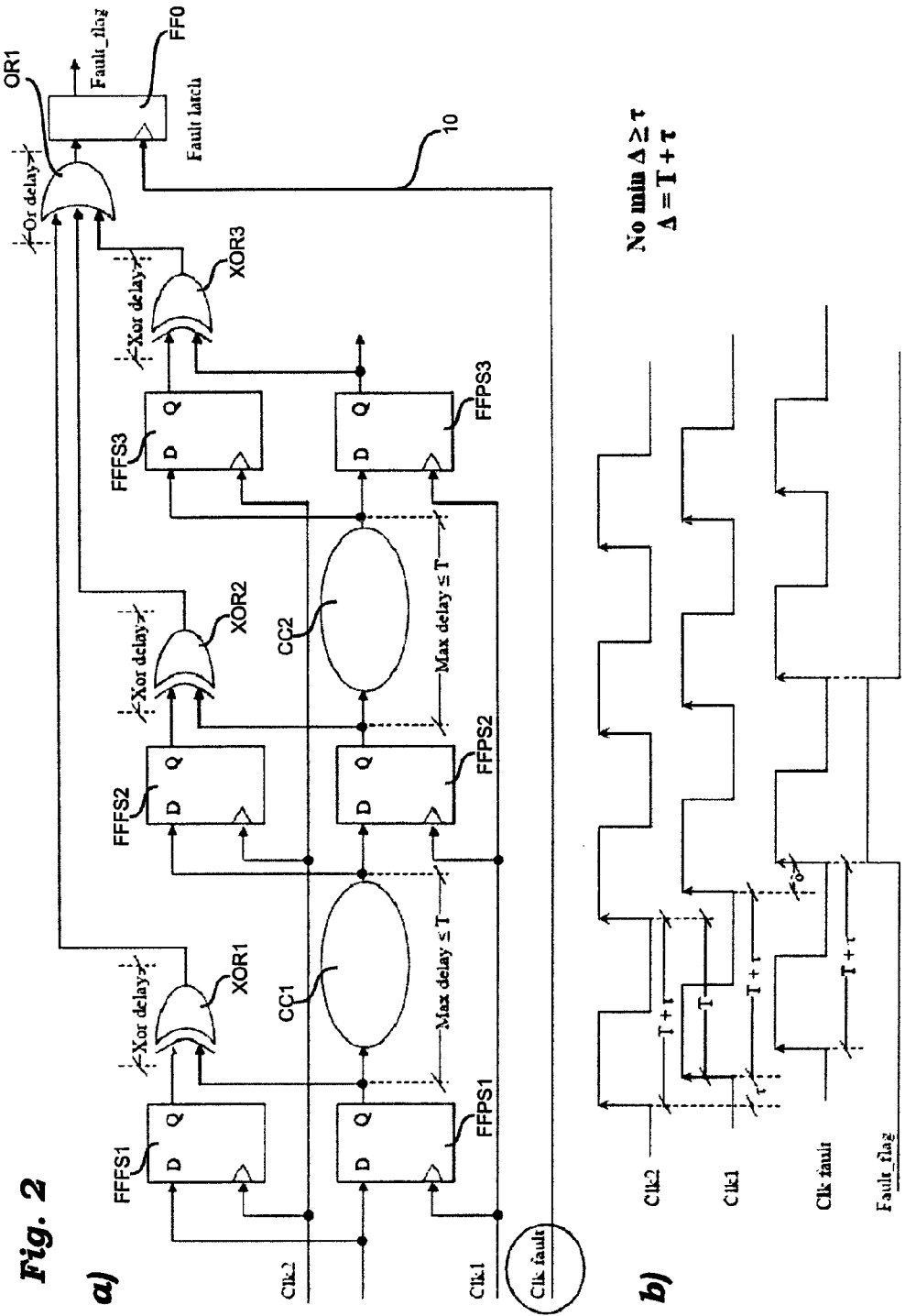

FIG. 2 shows that this possible drawback can be avoided by resorting to an auxiliary clock line 10 used only for the fault-latch function of the output flip-flop FFO via the application of a signal referred to as Clk fault, which can be generated at the rising edge present on the clock 10. It is here assumed that the signal Clk fault is a clock signal also with period T+τ, the rising edges of which have a delay δ with respect to the rising edges of the clock signal Clk1.

The value of δ is chosen greater than the sum of the delays of the XOR gates and of the gate OR1.

By adopting this solution, the possible presence of the signal Fault_flag can be verified in advance with respect to what occurs when the solution represented in FIG. 1 is adopted (this fact emerges clearly from a comparison of the chronograms of parts b) of FIG. 1 and FIG. 2).

Figure 3:
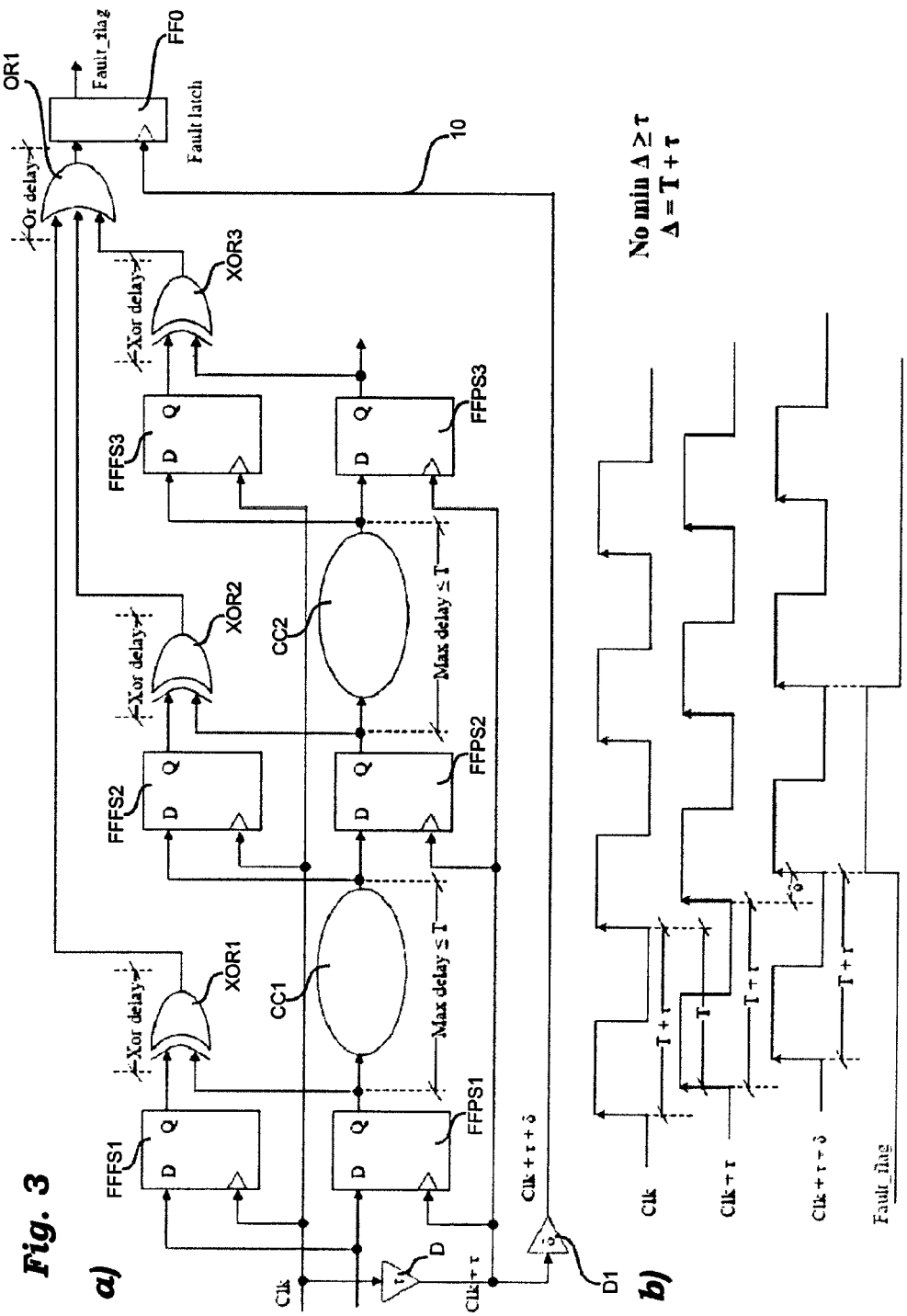

The diagram of part a) of FIG. 3 shows how the various clock signals used for timing the main pipeline and the error pipeline, and again the line 10 can be obtained from a single clock signal Clk by applying thereto a delay τ obtained via a delay element D plus a further delay δ applied via a delay element D1.

Of course it is assumed that the "master" signal designated by Clk is already a square-wave clock signal with period "lengthened" to the value T+τ.

The scheme of FIG. 4 regards a solution that derives conceptually from the same basic criterion previously illustrated with reference to FIGS. 1 to 3, i.e., that of adopting two clock signals Clk1 and Clk2 offset in time with respect to one another by an interval τ, with the aim, however, of preventing duplication of the flip-flops.

Figure 4:
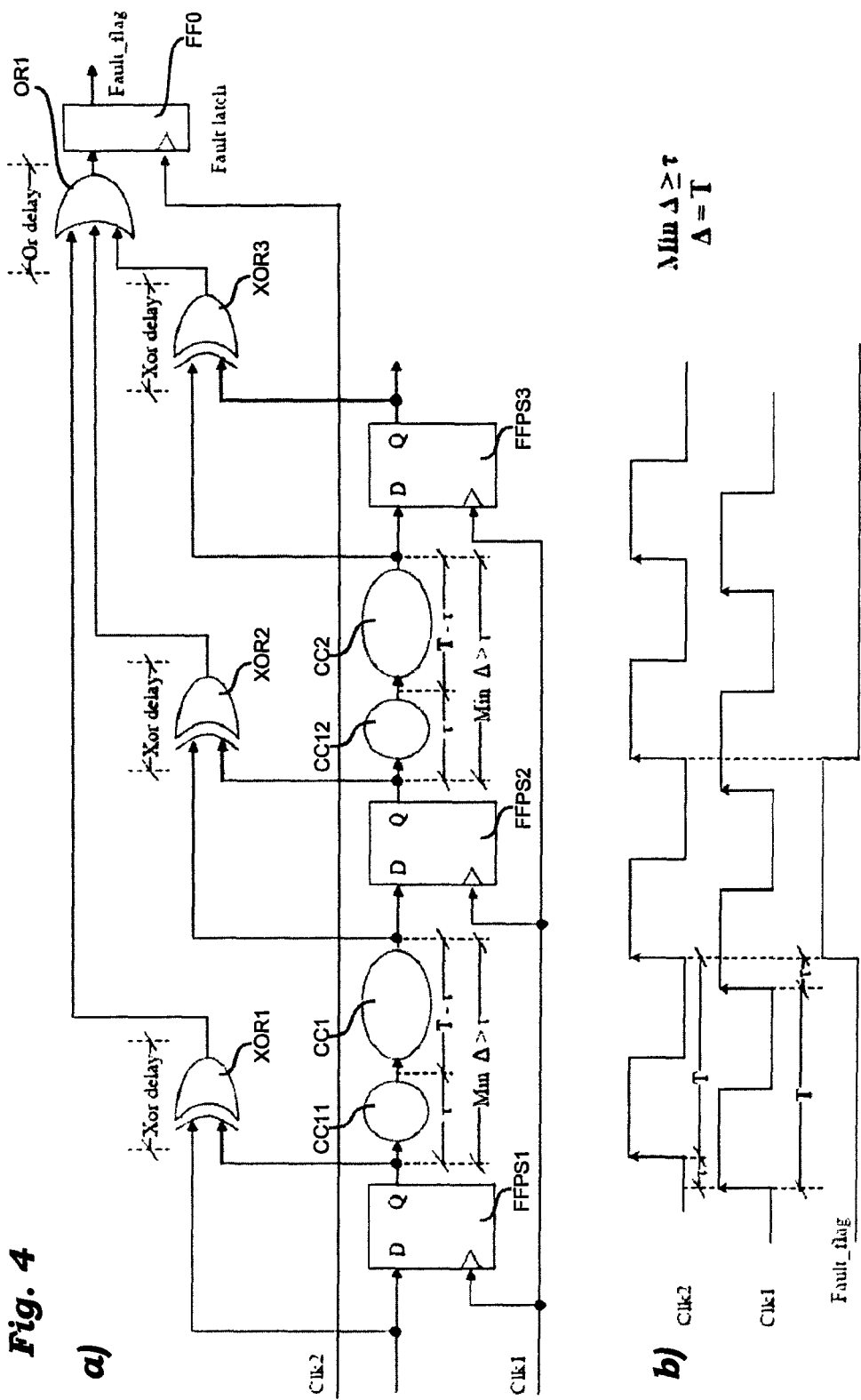

In this case (as may be appreciated more fully from the chronogram of part b) of FIG. 4), the two clock signals Clk1 and Clk2 (the latter used in practice only for driving the function of fault latch of the output flip-flop FFO) preserve the "original" period T. In the embodiment of FIG. 4, the inputs of the gates XOR1, XOR2 and XOR3 are connected, respectively, to the input and to the output of the individual flip-flops FFPS1, FFPS2, and FFPS3.

The outputs of gates XOR1, XOR2, and XOR3 are fed, as in the previous case, at input to the gate OR1, whilst the signal Fault_flag is subjected to latching on the positive edge (i.e., the rising edge) of the signal Clk2.

Also in the embodiment referred to in FIG. 4 (as likewise the subsequent FIG. 5), the time interval $\tau$ represents the granularity of the error-check function. In the case of the embodiment of FIG. 4 (and of FIG. 5), $\tau$ is longer than the sum of the delays of the XOR gates and of the OR gate so as to guarantee the proper latching of the signal Fault_flag.

In this case, to enable the action of check between the input and the output of each flip-flop to be carried out, the combinatorial circuits or networks set between the flip-flops are represented in the form of a "main" circuit CC1, CC2, which has a propagation delay of the signal T–$\tau$, and of an "ancillary" combinatorial circuit CC11, CC12, which presents a delay equal to $\tau$. In this way, the minimum path delay in the combinatorial circuits, which is greater than $\tau$, enables the hold time of the flip-flops to be taken into in account, ensuring that the value taken on the input of each flip-flop in the pipeline is compatible (in the sense that it refers to the same input datum) with the value taken on the output of the flip-flop so that the comparison of correspondence will have an effective meaning. A minimum delay longer than $\tau$ means that the new input propagates in the logic of the combinatorial circuit without being able to change the value on the output of the circuit itself.

Figure 5:
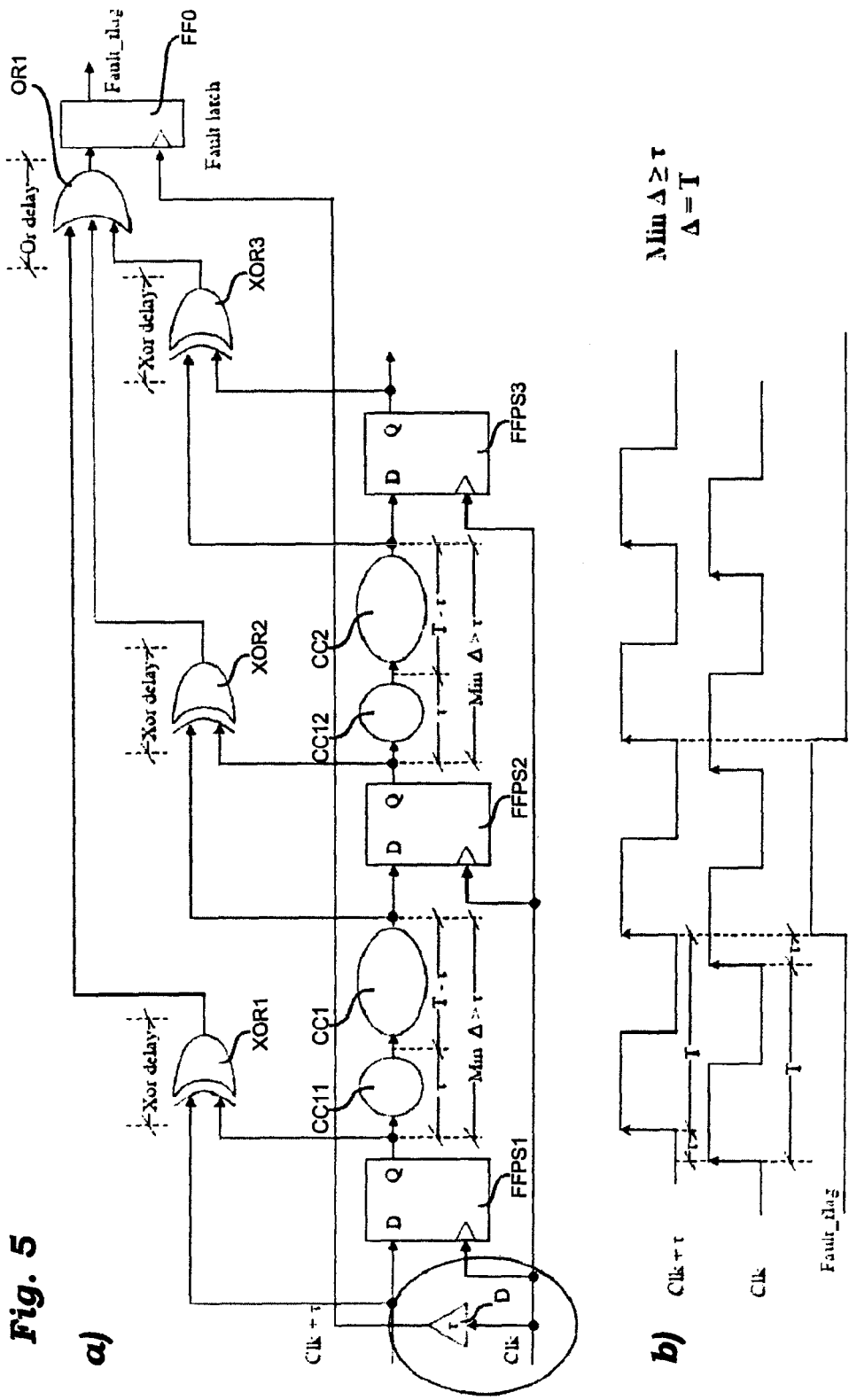

The solution referred to in FIG. 5 is conceptually similar to that of FIG. 4 and represents once again the possibility of generating the two clock signals Clk1 and Clk2 starting from a single master clock signal Clk (with period T) and a delay element D.

The solution of FIGS. 4 and 5 is able to recognize a fault in terms of reliability of a circuit scheme in a dynamic way (i.e., in real time) and is able to restart the "machine" through the signal Fault_flag (for example, using the reset circuit of a watchdog block). It will on the other hand be appreciated that the limitations on the delay times of the networks CC1, CC2, CC11 and CC12 do not constitute particularly pressing limitations in the majority of circuit applications designed using CAD techniques.

The diagrams represented in FIGS. 6 to 9 highlight how the principles outlined previously with reference to the solutions of FIGS. 1 to 3 (on the one hand) and the solutions of FIGS. 4 and 5 (on the other hand) can be combined with one another.

Figure 6:
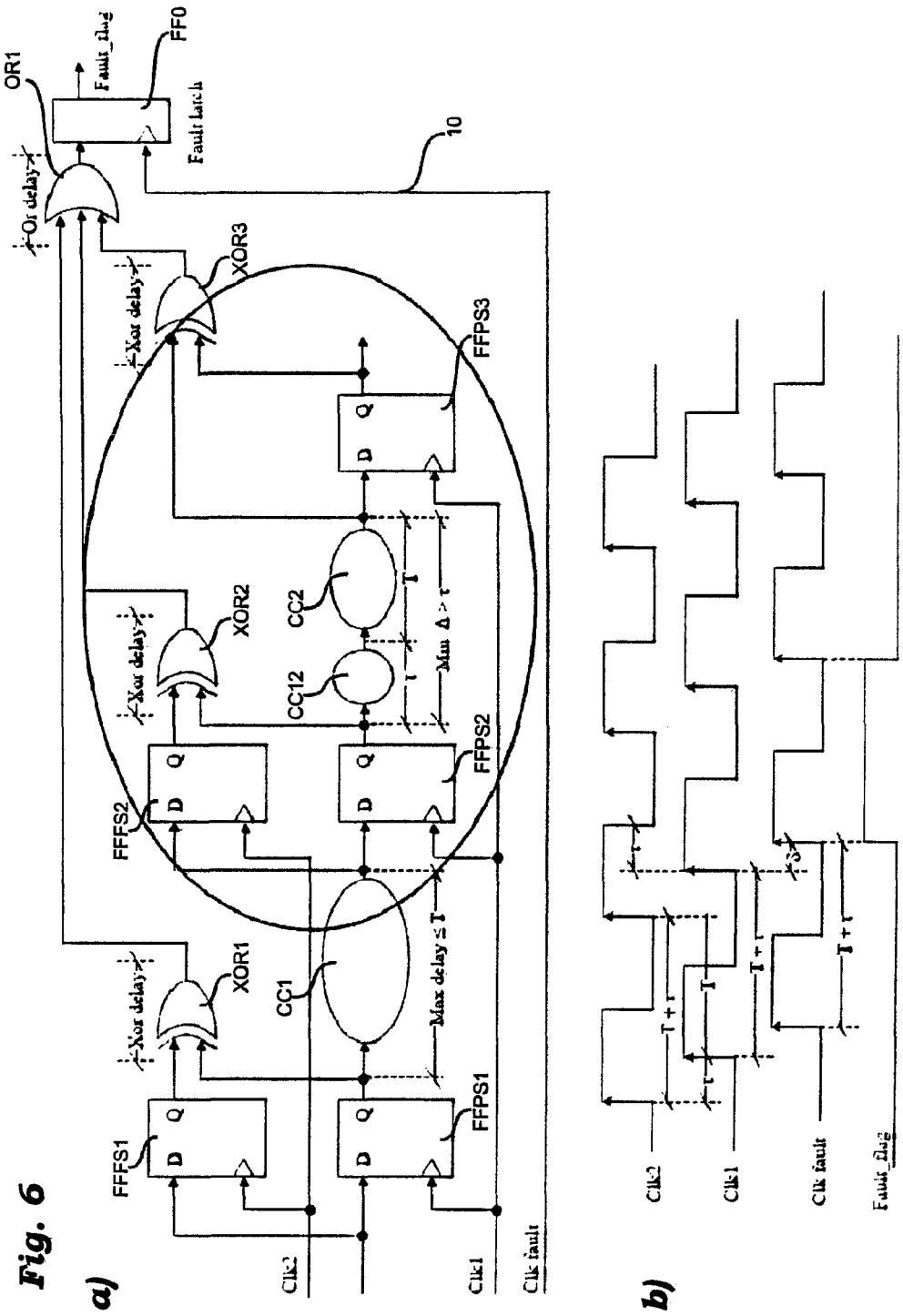

For instance, the diagram of FIG. 6 takes into account the fact that one of the main tasks of a fault-tolerant solution is to show an extreme flexibility in regard to current circuit-design techniques, in particular as regards the possibility of identifying, via a (static) preventive study, the parts of the circuit considered most critical from the reliability standpoint, proceeding if need be to a redefinition thereof.

The diagram of FIG. 6 envisages using two clock signals Clk1 and Clk2 offset by an interval $\tau$ and with their period extended to T+$\tau$ (as in the case of the solution of FIGS. 1 to 3), adopting a scheme of partial duplication of the pipeline so that only the flip-flops FFPS1 and FFPS2 of the main pipeline are effectively duplicated by flip-flops FFFS1 and FFFS2 of an error pipeline, with the gates XOR1 and XOR2 that compare the outputs of the homologous flip-flops of the main pipeline and of the error pipeline, whilst the third gate XOR3 implements, in relation to the flip-flop FFPS3 (which does not have a homologous flip-flop in the error pipeline), the input-output-comparison scheme of FIGS. 4 and 5.

In this regard, it will be appreciated that the respective conditions on the propagation delay linked to the input-output comparison are imposed on the networks CC2 and CC12 set between the flip-flops FFPS2 and FFPS3, whereas the network or circuit CC1 comprised between the flip-flops FFPS1 and the flip-flops FFPS2 satisfies the condition that the maximum delay must be shorter than or equal to T.

The diagram of FIG. 6 uses, as do the embodiments of FIGS. 2 and 3, the clock 10, present on which is the signal Clk fault used for governing latching of the output flip-flop FFO at the rising edge. The delay 5 between Clk1 and Clk fault is longer than the sum of the delays of propagation through the XOR gates and the OR gate. Also the solution of FIG. 6 is able to recognize a fault in terms of reliability of a system in a dynamic way (in real time) and is able to govern restarting of the "machine" with the signal Fault_flag (for example, using the reset circuit of a watchdog block).

Figure 7:
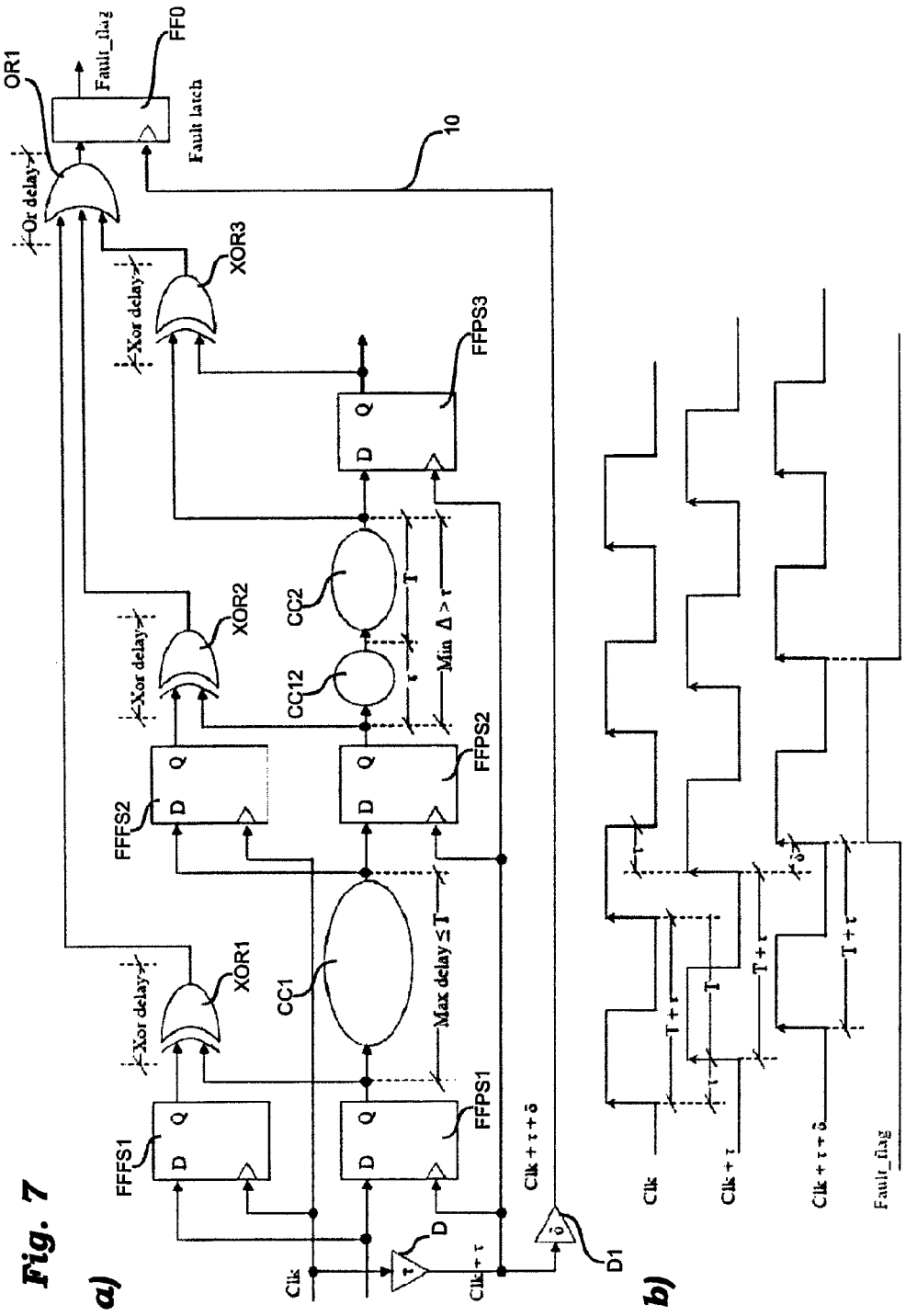

The diagram of FIG. 7 can be conceptually brought back to the diagram of FIG. 6 but for the fact that in the diagram of FIG. 7 the various clock signals used are obtained starting from a master clock signal (which can be seen as corresponding to the signal Clk2) through delay elements D (delay $\tau$) and D1 (delay $\delta$).

Figure 8:
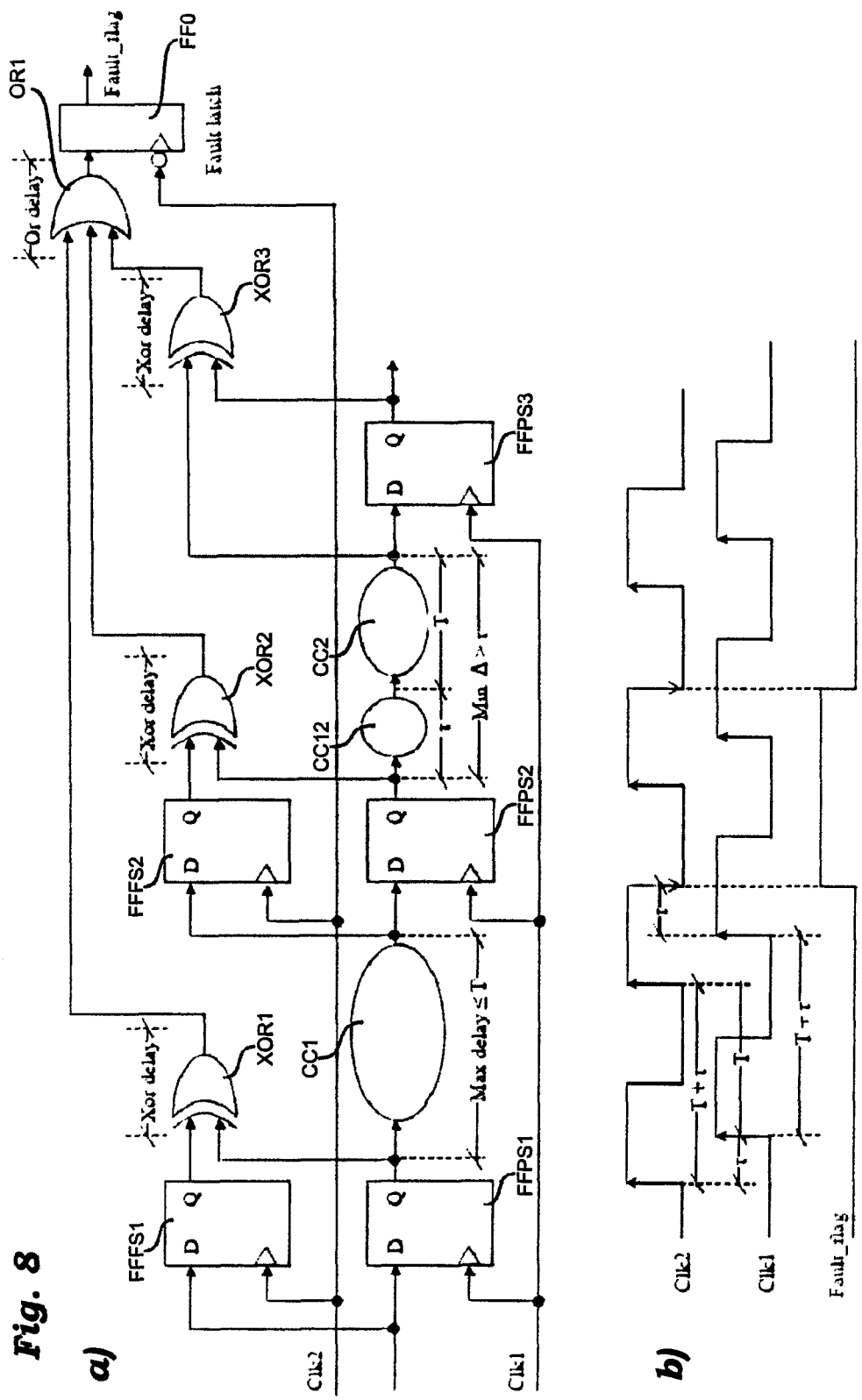

The diagram of FIG. 8 can be viewed as deriving from the diagram of FIG. 6 (and of FIG. 7) by omitting the clock 10 on which the clock signal Clk fault is present. In the case of the diagram of FIG. 8 (see again the chronogram represented in the bottom portion, part b) of FIG. 8) the fault-latch input of the output flip-flop FFO is driven (on the falling edge) by the signal Clk2. In this case, the delay $\tau$ between Clk2 and Clk1 is equal to (T+$\tau$)/4, which implies that $\tau$ is equal to T/3 since it is still longer than the delay of the XOR and OR gates.

Figure 9:
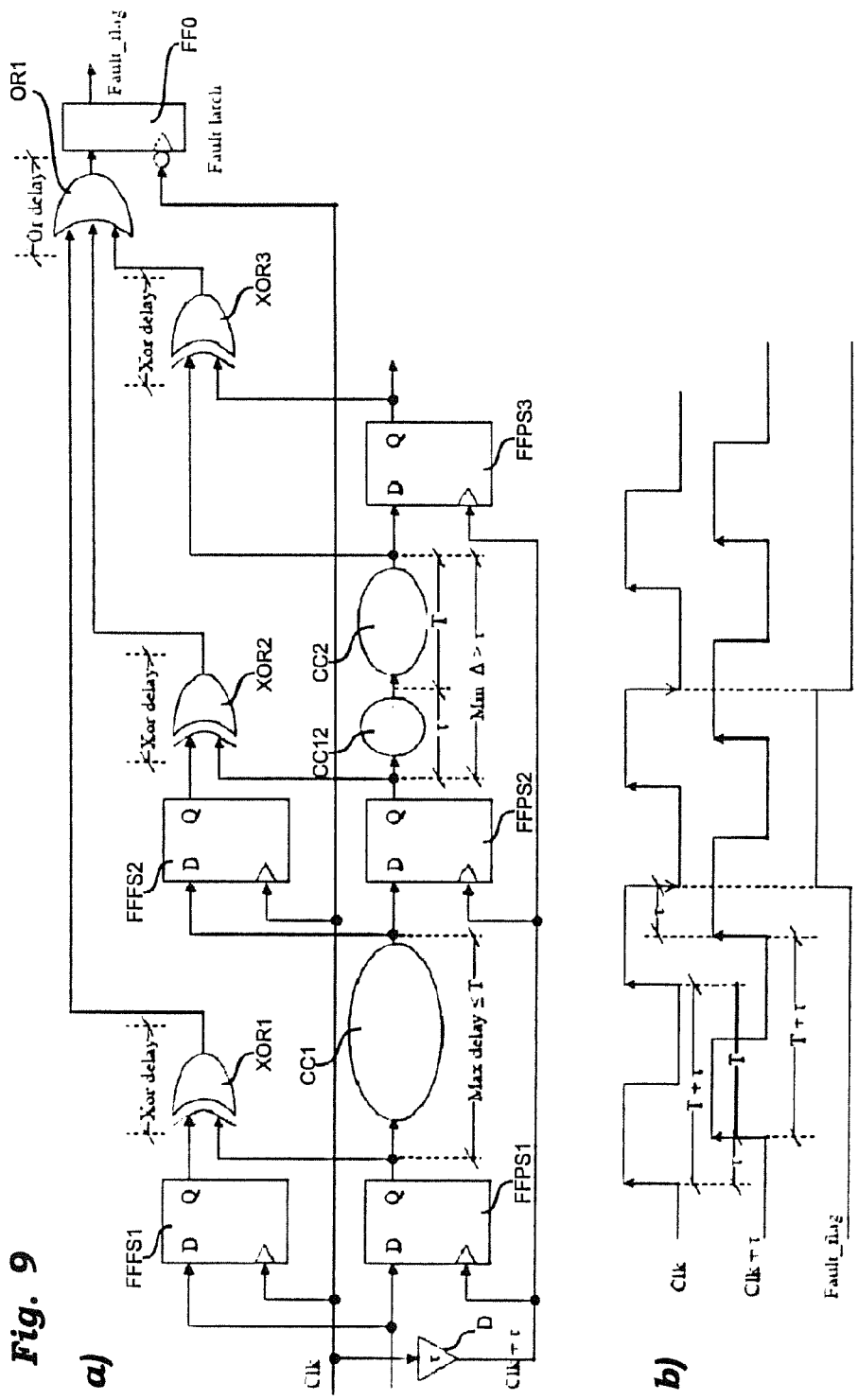

The diagram of FIG. 9 shows how the two clocks Clk2 and Clk1 of FIG. 8 can be obtained from a single master clock (for example, corresponding to the clock Clk 2) by resorting to a delay element D.

Figure 10:
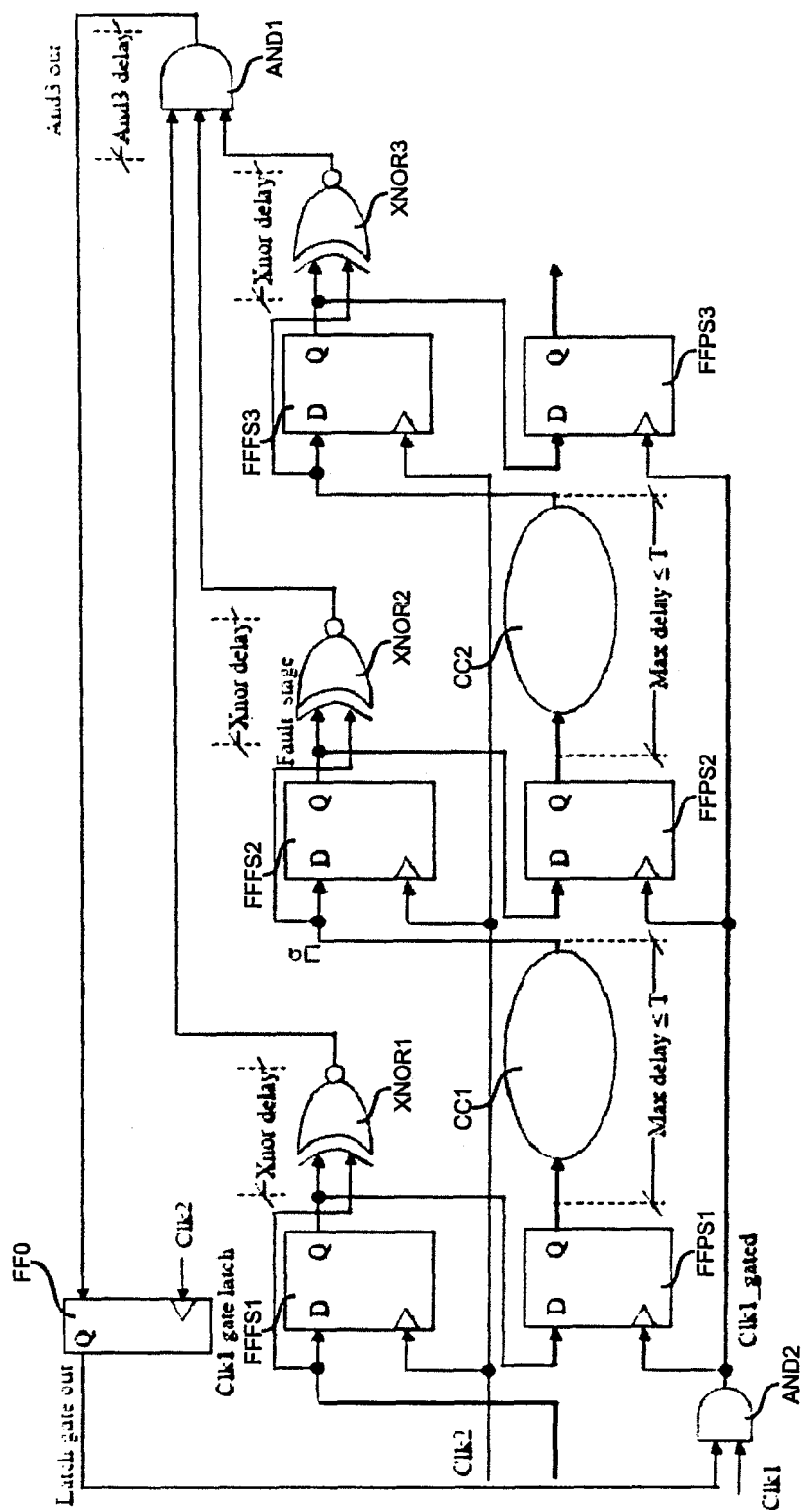
FIG. 10 is a further block diagram of a circuit according to one embodiment.

The diagram of FIG. 10 regards a solution that is able to recognize an error and recover it by stalling the pipeline structure just for one clock cycle for each error so as to be able to recalculate the output of the combinatorial circuit where the problem arises without any need to start the machine again.

Basically (and for reasons of simplicity of illustration) the diagram of FIG. 10 can be viewed as a diagram that can basically be brought back to the diagram of FIG. 1 as regards the presence of an error pipeline (flip-flops FFFS1, FFFS2 and FFFS3), which reflects in a complete way the main pipeline that includes the flip-flops FFPS1, FFPS2 and FFPS3 with the combinatorial networks or circuits CC1 and CC2 interposed between them.

The clock signals Clk1 and Clk2 are once again two clock signals with the original period T lengthened to the value T+V, where $\tau$ represents the granularity of the control action.

The comparison of correspondence between the two versions of the same signal underlying the action of error detection is in this case entrusted to three XNOR gates, respectively XNOR1, XNOR2 and XNOR3, which have their inputs connected respectively to the input (D) and to the output (Q) of a respective flip-flop FFFS1, FFFS2 or FFFS3 of the error pipeline. The output signal of each of said flip-flops, in addition to being sent to one of the inputs of the associated XNOR gate is also sent to the input of the homologous flip-flops FFPS1, FFPS2 or FFPS3 in the main pipeline.

The outputs of the gates XNOR1, XNOR2 and XNOR3 are fed once again to a logic gate, which, in the case of the embodiment of FIG. 10, is a logic gate of an AND type (logic product), designated by AND1, the output of which is sent to the output flip-flop FFO, which is once again clocked, in a function Clk gate latch by the clock signal Clk2. The output of the output flip-flop FFO is constituted by a signal Latch gate out, which in turn is fed to a logic gate of an AND type designated by AND2, together with the clock signal Clk1.

The output of the gate AND2 is used as signal Clk1_gated for timing the flip-flop of the main pipeline.

As regards the combinatorial-circuit networks CC1 and CC2, the condition is applied whereby the maximum propagation delay is shorter than or equal to the period T. It will then be assumed that the XNOR gates (XNOR1, XNOR2 and XNOR3) and the AND gate (AND1) present respective values of propagation delay.

After the instant of initialization, in the solution of FIG. 10 the output data of each combinatorial circuit CC1 and CC2 are stored, not in the flip-flops FFPS2 and FFPS3 of the main pipeline, but in the homologous flip-flops FFFS2 and FFFS3 of the error pipeline. This occurs at two distinct instants separated from one another by the delay τ, in such a way that the combinatorial circuit upstream of each flip-flop does not have time to present a new input during the interval τ.

Each XNOR gate is thus able to recognize the difference between the two versions of the same signal, namely, the one stored in the stage of the error pipeline (fault_stage) and the other present on its input (and hence possibly affected by the noise pulse). The output of each stage or flip-flop of the error chain is then transferred, thanks to the connection described, to the homologous flip-flop in the main pipeline.

The gate AND1 collects possible errors recognized by the gates XNOR1, XNOR2 and XNOR3, and the corresponding signal is latched as a function of the signal Clk gate latch controlled by the levels of the clock signal 2.

The signal Clk1 gate latch is able to perform, through the gate AND2, a gating action of the signal Clk1 so as to stall the pipeline for a single clock cycle, recalculating the stage of the pipeline where the error emerged.

Figure 11:
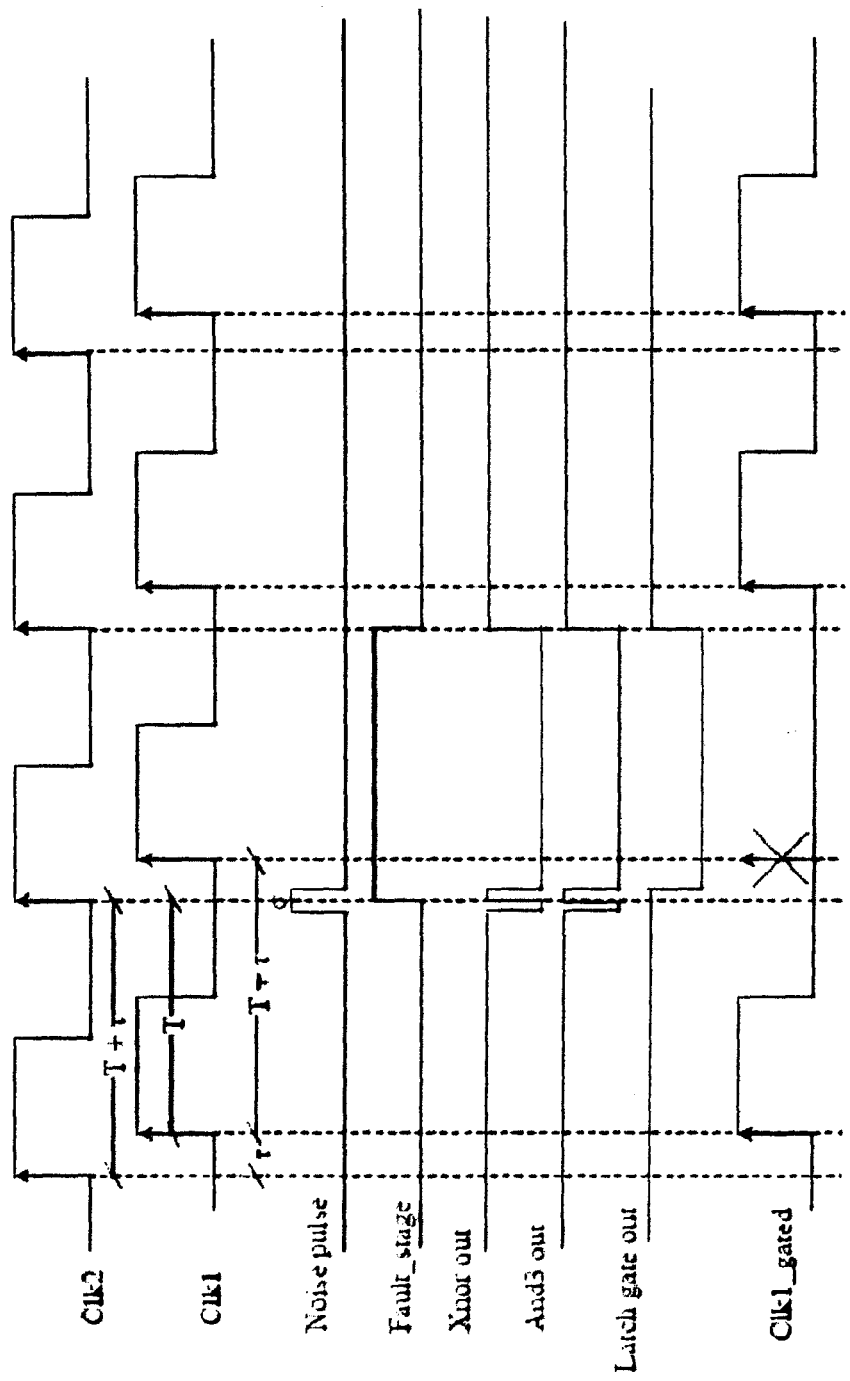
FIGS. 11 and 12 are two corresponding chronograms.

The corresponding behavior is illustrated in the chronogram of FIG. 11, which represents an action of transient-error check recovery in one clock cycle. In the example considered for reasons of simplicity, it has been assumed that the fault is present in the combinatorial circuit CC1 (i.e., in the combinatorial circuit comprised between the flip-flop FFPS1 and the flip-flop FFPS2) and that the pulse (noise pulse σ) responsible for the fault arises at—i.e., astride of—the rising edge of Clk2. It will be appreciated that this embodiment operates even though the pulse noise σ is determined at the rising edge of Clk1, as represented in the chronogram of FIG. 12.

The embodiment of FIG. 10 (which is able to preserve the circuit in regard faults that arise in the feedback network that manages the function of gating of the clock signal Clk1) can be conceptually equated, but for the presence of the XNOR gates instead of the XOR gates and the presence of the gate AND1 instead of the gate OR1 (and of course for the feedback function of gating exerted on the signal Clk1), to the basic scheme represented in FIG. 1.

Consequently the basic scheme of FIG. 10 is suited, mutatis mutandis, for application of the various modifications of the basic scheme of FIG. 1 illustrated in the diagrams of FIGS. 2 to 9.

Figure 12:
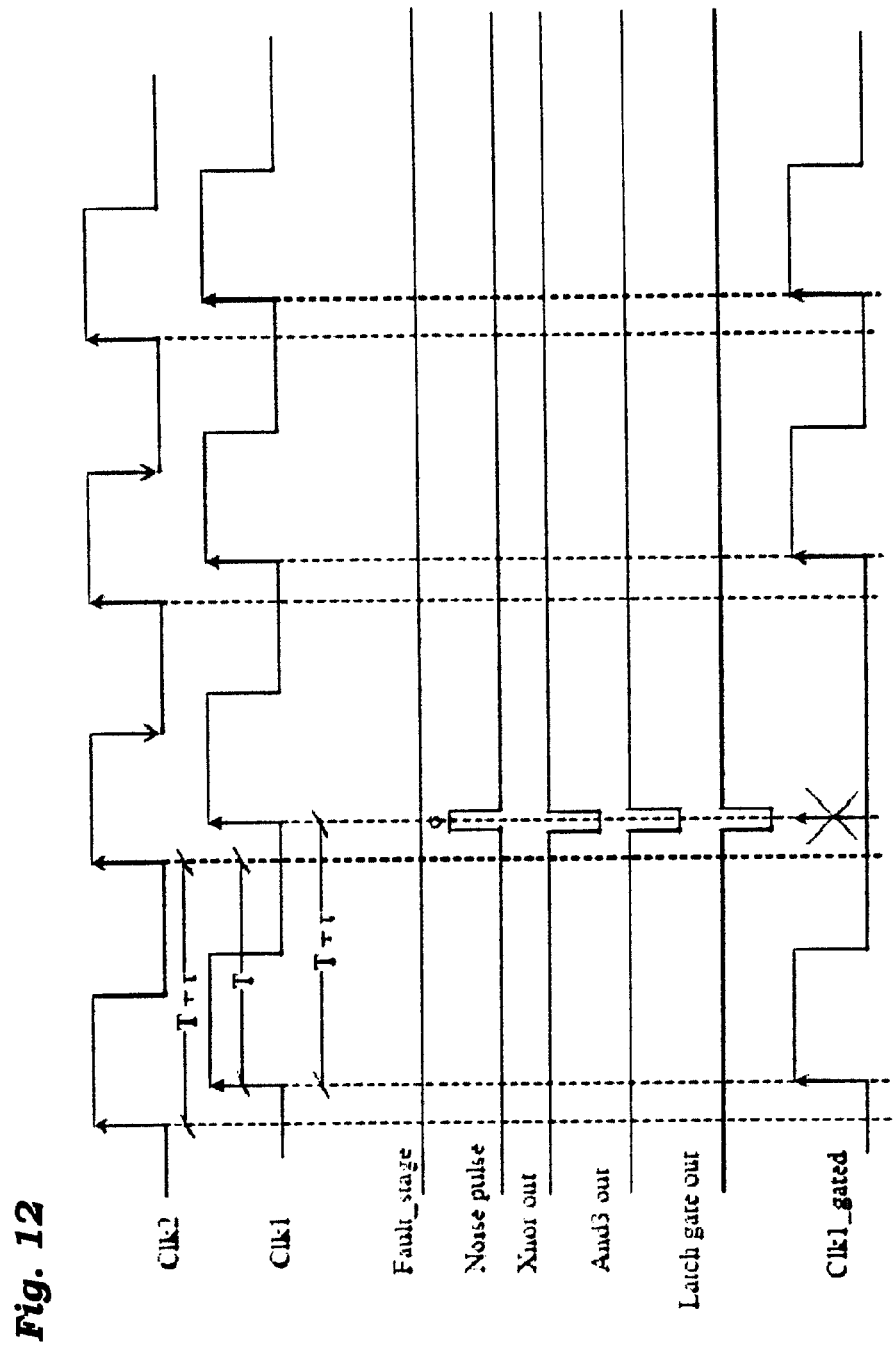
Figure 13:
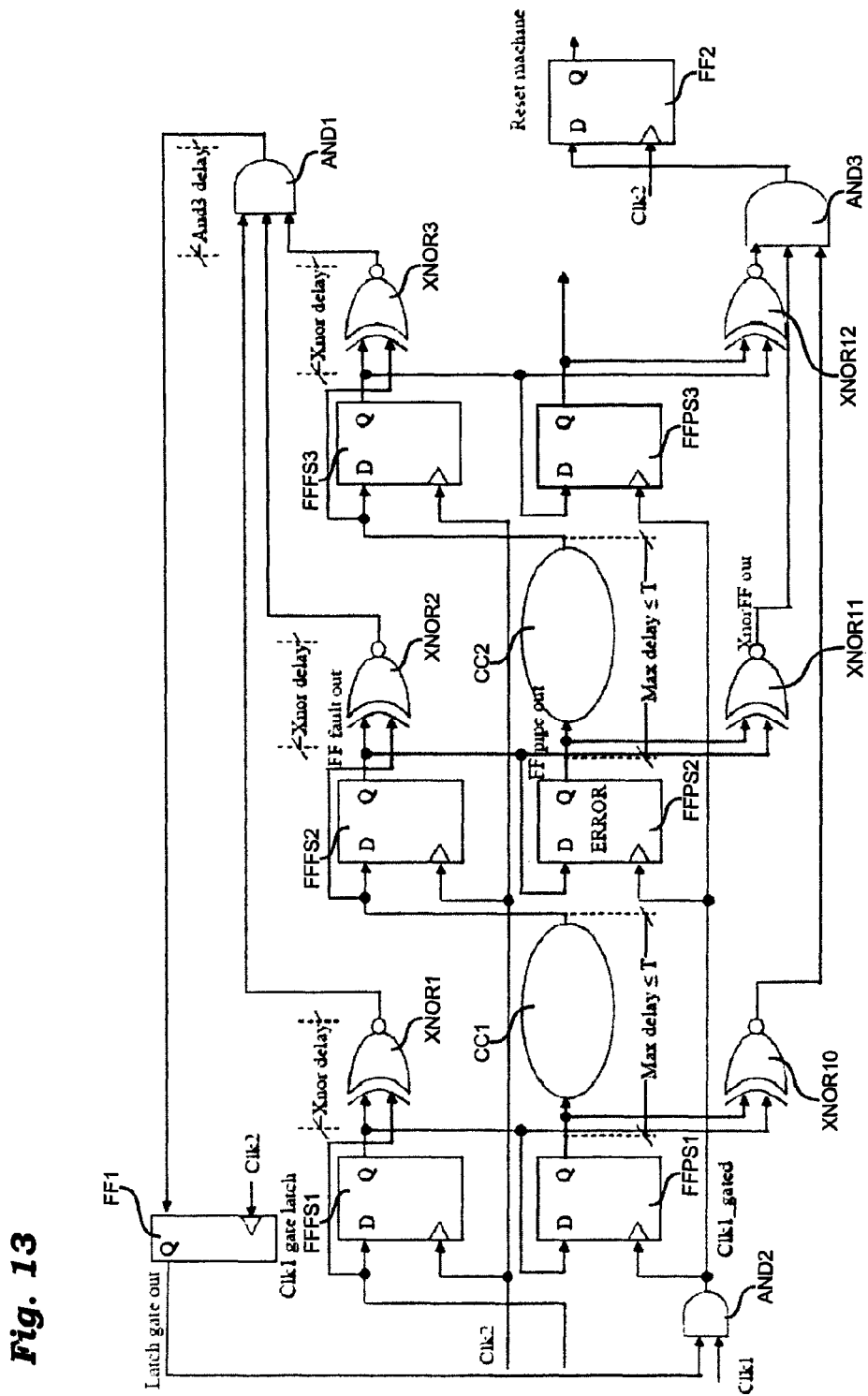
FIG. 13 is a block diagram of one embodiment.

The diagram of FIG. 13 highlights a further possible development of the diagram of FIG. 12, envisaged in which is the presence of three further gates of an XNOR type (designated, respectively, by XNOR10, XNOR11 and XNOR12), each of which has its inputs connected, respectively, to the input and the output of a respective flip-flop, this time of the main pipeline. Also for the embodiment of FIG. 13 there apply the same considerations made in relation to the embodiment of FIG. 10 as regards the possibility of applying to said diagram the variants of implementation presented with reference to the preceding figures.

Figure 14:
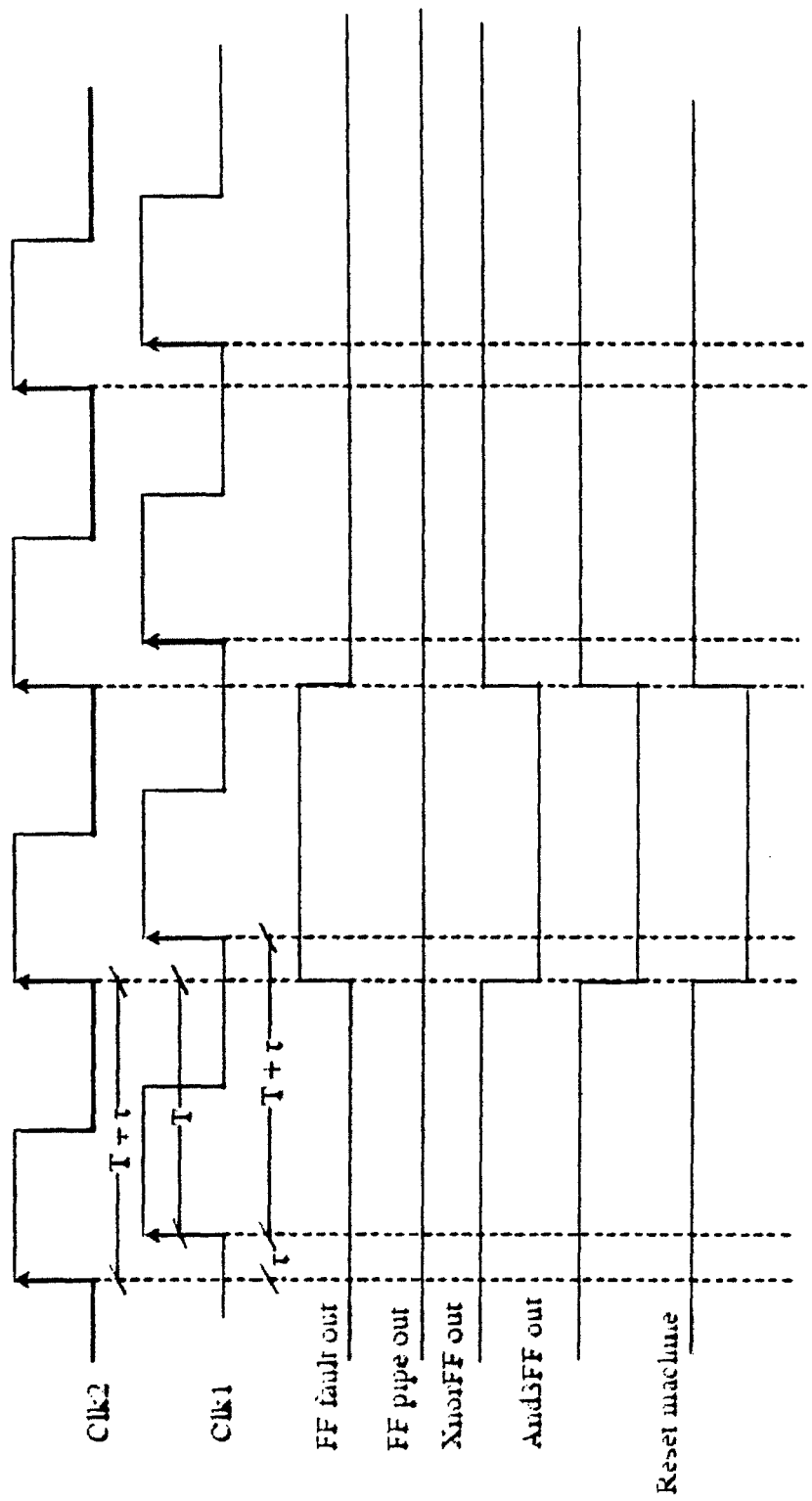
FIGS. 14 and 15 illustrate two corresponding chronograms; in particular, FIG. 15 comprises a part a) representing a chronogram, and a part designated by b) representing a corresponding circuit detail.
Figure 15:
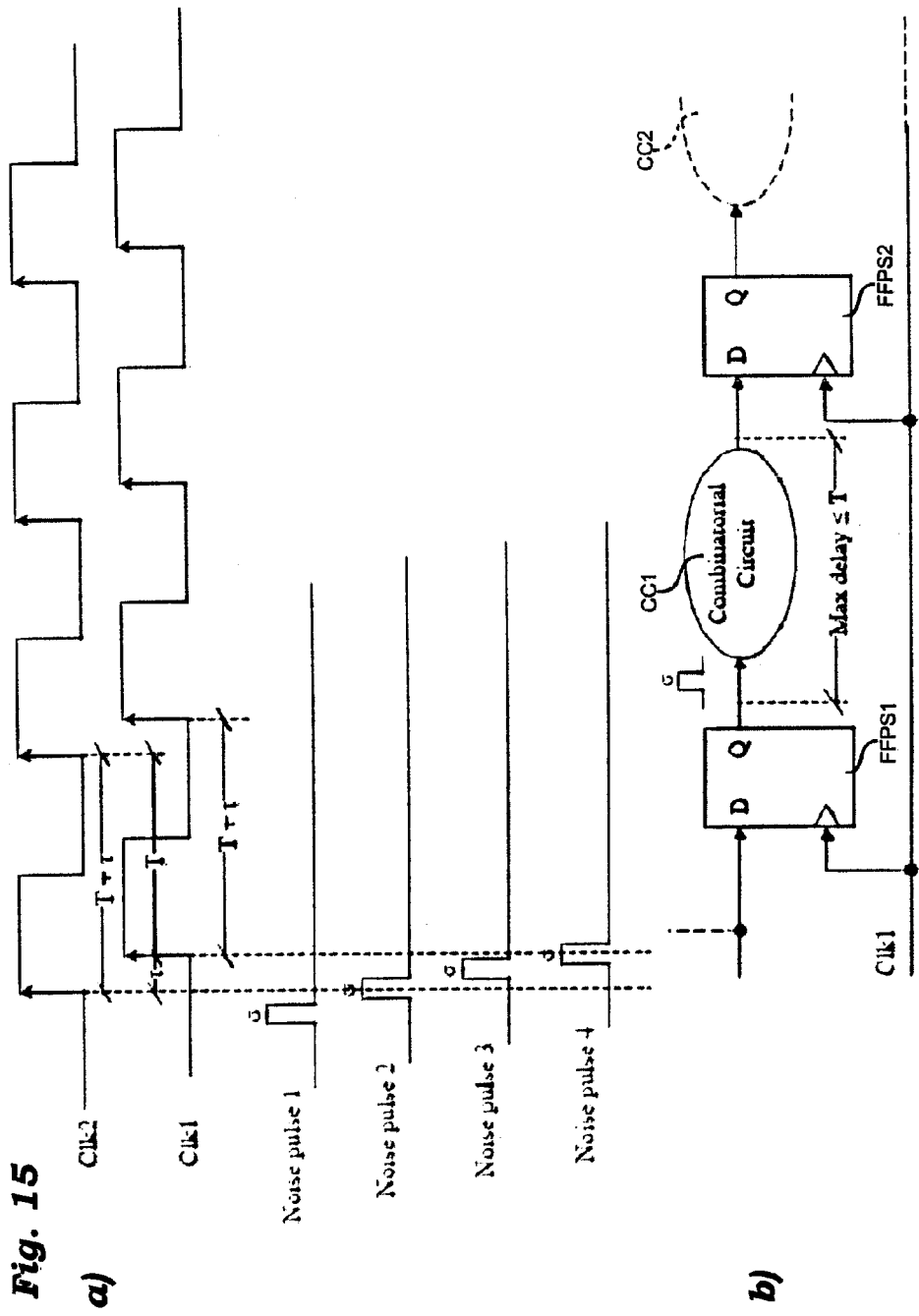

In the diagram of FIG. 13, the outputs of the gates XNOR10, XNOR11 and XNOR12 are fed to an AND gate designated by AND3, which in turn drives a flip-flop FF2 clocked by the clock signal Clk2 according to the modalities illustrated more fully in the chronograms of FIGS. 14 and 15.

FIG. 14 refers to a permanent fault present only in the second stage (i.e., the flip-flop FFPS2) of the main pipeline.

FIG. 15 represents the possibility of providing an action of control on various types of noise pulses σ (Noise pulse 1, 2, 3, 4) according to the possible different temporal recurrences of the disturbance pulse, respectively prior to the rising edge of the clock Clk2 (Noise pulse 1), astride of said rising edge (Noise pulse 2), between the rising edge of the clock Clk2 and the rising edge of the clock Clk1 (Noise pulse 3), and astride of the rising edge of the clock Clk1 (Noise pulse 4). The bottom part of FIG. 15 is a schematic representation of the mechanism of propagation of the noise pulse between the first and second stages FFPS1 and FFPS2 of the main pipeline.

The chronogram of FIG. 15 aims at highlighting how the delay τ (whatever the way in which it is used in the framework of the various embodiments considered herein) represents the granularity of the error-checking action. In particular, the higher the sensitivity of the system, the lower the value of the delay τ, so as to render adaptation of the temporal limitations accordingly more refined.

It will be appreciated that the two conditions identified as Noise pulse 2 and Noise pulse 4, i.e., the situations in which the noise pulses fall astride of the rising edges of the clock signals, represent two situations in which the error can be clearly identified.

The pulse designated as Noise pulse 3 highlights further the concept of granularity. In particular, if the duration σ of the pulse is shorter than τ and the pulse falls between the rising edges of Clk2 and Clk1 the mechanism illustrated here does not detect any error: this does not constitute a limitation since here the pulse does not create any negative phenomena.

To clarify our ideas—without this of course implying any negative repercussion on the scope of the invention—, an alpha particle is able to induce a level of charge in the range comprised between 1 and 5 pC (picoCoulomb), the level of charge being determined by the angle of impact/injection in the chip. Even if we take into account the maximum level of charge of 5 pC, the transient induced by an alpha particle has a duration of the order of fractions of a nanosecond (e.g., up to 0.5 ns). The verification data show, for example, that a charge of 2 pC is able to modify the output of a combinatorial circuit, whereas instead a charge of 1 pC is usually unable to obtain this effect.

As has already been said, a noise charge that initially has no effect on proper operation of a digital circuit can, however, present negative effects after being propagated through the gates thereof. The propagation delay depends upon by the transition time at input (typically expressed in nanoseconds), i.e., the time necessary for the input to change from 0 to 1. The transition time for an alpha particle is at the most 0.03 ns corresponding to a propagation delay of between −0.004 and +0.004 ns. It will thus be appreciated that, by regulating the delay τ, it is possible to guarantee the reliability of a critical part of a circuit that operates in fault-free conditions, causing transition times of this nature not to have an appreciable effect.

Figure 16:
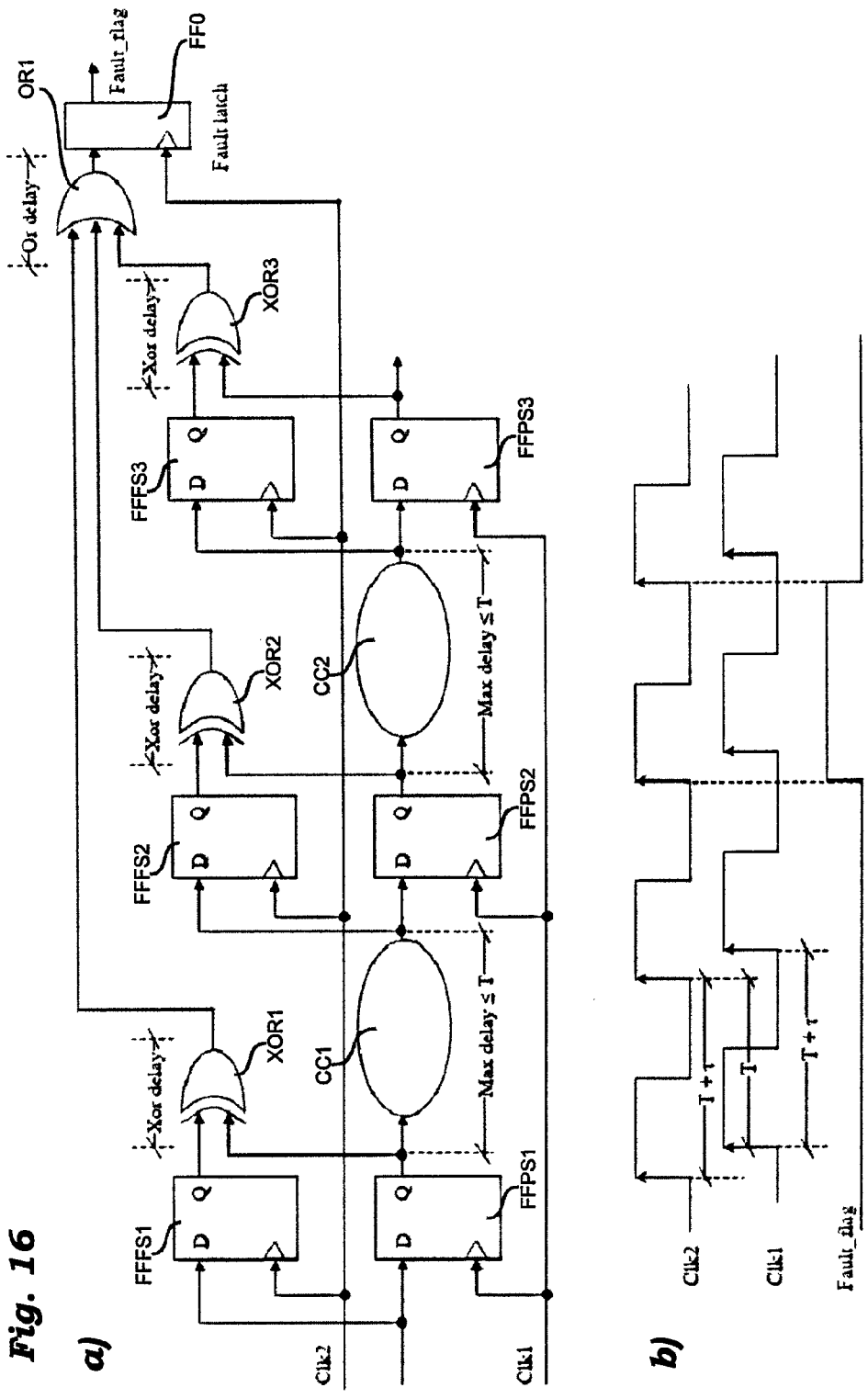
FIG. 16 also comprises a first part, designated by a), constituting a circuit diagram of one embodiment and a second part, designated by b), representing a corresponding chronogram regarding the waveforms of some signals present in the circuit of part a) of the same figure.

The diagram of FIG. 16 reproduces, from the circuit standpoint, a solution in effect identical to the one represented in FIG. 1, highlighting, at the level of the chronogram of part b) that the solution described here is able to render "robust", in regard to a generic noise pulse, not only the combinatorial parts of a circuit such as an integrated circuit, but also the parts that have characteristics of a sequential type (e.g., flip-flops).

In this regard, known to the art are solutions that aim at identifying events of this nature (which cause variations of the values stored in the sequential blocks) via solutions such as the use of parity bits or else redundant structures integrated in the sequential units (typically flip-flops and latches) provided that the technology enables these solutions to be adopted. FIG. 16, in particular the chronogram of part b) highlights the fact that the same circuit of FIG. 1, made to work in such a way as to provide the function of error detection on the rising edge of the clock signal Clk2, is able to guarantee the end of the loading/storage procedure of the flip-flops and to ensure correct check of the possible recurrence of an unexpected noise pulse within the flip-flops or latches.

The various embodiments described hence enable detection of errors induced by noise pulses σ in digital electronic circuits clocked with a (first) clock signal having a given period. This result is obtained by providing at least one further clock signal (usually having the same period as the first clock) offset in time by a given interval τ. Then in a position corresponding to at least one component of the circuit (e.g., the flip-flops FFPS1, FFPS2, FFPS3) a comparison of correspondence (e.g., XOR or XNOR) is carried out between two versions of one and the same signal; the comparison is clocked by the further clock signal, and the absence of correspondence between the two versions of the signal subjected to correspondence check identifies an error induced by a noise pulse. By selectively varying the duration of the offset interval (τ) it is possible to vary the resolution (granularity) of the action of detection.

In some embodiments, coupled to the aforesaid at least one component (FFPS1, FFPS2, FFPS3) is a homologous component (FFFS1, FFFS2, FFFS3) operating in redundancy. The two versions of the signal that are subjected to correspondence check may in this case be the output signals (Q, Q) of the component (FFPS1, FFPS2, FFPS3) and of the associated redundant component (FFFS1, FFFS2, FFFS3).

In certain embodiments (see e.g., FIGS. 4 and 5 or, in part, FIGS. 6 and 7), the comparison of correspondence between two versions of one and the same signal is obtained—at least for some components—as comparison of correspondence between the input signal (D) and the output signal (Q) of the component (FFPS1, FFPS2, FFPS3), without envisaging a homologous component operating in redundancy of the circuit.

In certain embodiments, the comparison of correspondence is obtained as a function of exclusive OR (XOR). In certain embodiments (see, e.g., FIG. 10 or FIG. 13), the comparison of correspondence is obtained as an XNOR function.

In various embodiments, the comparison of correspondence is obtained for a plurality of components (FFPS1, FFPS2, FFPS3), feeding the results of said plurality of comparisons of correspondence to a function of logic sum (OR) or logic product (AND), the outcome of the logic sum or of the logic product representing a possible error induced by a noise pulse in said digital circuit.

In various embodiments, the result of the logic sum is subjected to latching with a signal chosen from between the (first) clock signal (Clk1), the further clock signal (Clk2), and a clock signal (Clk_fault) for latching of the error.

In various embodiments (see e.g., FIGS. 10 and 13), the result of the logic product is used for a gating action (AND2) of the clock signal (Clk1)

In various embodiments, the clock signals involved are generated starting from a main clock signal (Clk) subjected to corresponding delays (D, D1).

In certain embodiments (see, e.g., FIGS. 10 and 13), the comparison of correspondence is implemented as an XNOR function between the input and the output (D, Q) of at least one component of the circuit (FFFS1, FFFS2, FFFS3) and/or of a coupled homologous component (FFPS1, FFPS2, FFPS3) operating in redundancy.

In various embodiments, the component considered is a flip-flop (FFPS1, FFPS2, FFPS3) comprised in a pipeline structure, for example as pipeline of cascaded flip-flops with combinatorial circuits (CC1, CC2; CC11, CC12) interposed between them.

It will on the other hand be appreciated that in all the circuits described it is possible to replace the fault-stage flip-flops (FFFS1, FFFS2, FFFS3) with latches that use the same clock signal used by the flip-flops, purposely negated. In this way, it is possible to introduce variants to the solutions proposed that will have the same functionality but will occupy less area.

Table I below summarizes the characteristics of the various embodiments illustrated herein with reference to the following parameters:
- # FF: number of flip-flops used in each pipeline stage for each information bit;
- # Clock: number of independent clocks necessary for the circuit (these clocks have the same period and duty-cycle but are delayed with respect to one another);
- # Clk deriv: number of clocks derived internally with a simple delay circuit;
- CLK Delay: YES means that the master-clock period must be incremented by the delay τ that represents the granularity of recognition of the pulse; NO otherwise;
- Min CN Delay: YES means that the combinatorial network between the two pipeline stages must present a minimum delay of τ; NO otherwise;
- Correction: type of correction that can be adopted; namely,
  - R/R: Reset of the circuit or re-start from a known point (with circuit of a known type);
  - Wait Pipeline: the pipeline is blocked and it is necessary to wait for another clock cycle to obtain recalculation of the correct value (with the circuit described in the present patent description).

TABLE I

| FIG. | #FF | #Clock | #Clk derive | CLK Delay | Min CN Delay | Correction |
|---|---|---|---|---|---|---|
| FIG. 1 | 2 | 2 | 0 | YES | NO | R/R |
| FIG. 2 | 2 | 3 | 0 | YES | NO | R/R |
| FIG. 3 | 2 | 1 | 2 | YES | NO | R/R |
| FIG. 16 | 2 | 1 | 2 | YES | NO | R/R |
| FIG. 4 | 1 | 2 | 0 | NO | YES | R/R |
| FIG. 5 | 1 | 1 | 1 | NO | YES | R/R |
| FIG. 6 | 2 | 3 | 0 | YES | NO | R/R |
| FIG. 7 | 2 | 1 | 2 | YES | NO | R/R |
| FIG. 8 | 2 | 2 | 0 | YES | NO | R/R |
| FIG. 9 | 2 | 1 | 1 | YES | NO | R/R |
| FIG. 10 | 2 | 2 | 0 | YES | NO | Wait Pipeline |
| FIG. 13 | 2 | 2 | 0 | YES | NO | Wait Pipeline |

Table II sums up further characteristics of the various embodiments illustrated herein.

TABLE II

| FIG. | Note |
|---|---|
| FIG. 1 | Error signal on falling edge of Clk, delay of approximately (T + τ)/2. |

TABLE II-continued

| FIG. | Note |
| --- | --- |
| FIG. 2 | Error signal delayed only by the delay of the recognition circuit (XOR + OR). |
| FIG. 3 | Error signal delayed only by the delay of the recognition circuit (XOR + OR). |
| FIG. 16 | Error signal on rising edge of the clock and hence delayed by T. |
| FIG. 4 | Error signal delayed with respect to the master clock by the granularity and recognition delay (XOR + OR). |
| FIG. 5 | Error signal delayed with respect to the master clock by the granularity and recognition delay (XOR + OR). |
| FIG. 6 | Mixed solution that includes the solution of FIG. 1 and FIG. 4. |
| FIG. 7 | Error signal delayed only by the delay of the recognition circuit (XOR + OR). |
| FIG. 8 | Error signal on falling edge of Clk; delay of approximately $(T + \tau)/2$. |
| FIG. 9 | Error signal on falling edge of Clk; delay of approximately $(T + \tau)/2$. |
| FIG. 10 | Immediate correction; error recognition only on combinatorial network. |
| FIG. 13 | Immediate correction following upon error recognition on combinatorial network. Reset for error on FF. |

It will in particular be appreciated that, whereas the solutions of FIGS. 2, 3 and 16 can be basically brought back to the solution of FIG. 1 (which does not present a minimum delay on the CN but has two flip-flops —correction with reset or recovery of known state), the solution of FIG. 5 can basically be brought back to the solution of FIG. 4 (which has a minimum delay on the CN and uses just one flip-flop—correction with reset or recovery of known state).

The solutions of FIGS. 7, 8 and 9 can basically be brought back to the solution of FIG. 6 (mixed solution of the two preceding ones—correction with reset or recovery of known state), and the solution of FIG. 13 can basically be brought back to the solution of FIG. 10 (which is a more complex solution, which, however, enables correction of the error with a delay of just one clock beat, blocking the pipeline so as to recalculate the error).

The variants to the solutions referred to above are based upon the local generation of the delayed clocks and/or on the clock fault.

Without prejudice to the principle of the invention, the details of implementation and the embodiments may vary, even significantly, with respect to what has been illustrated herein purely by way of non-limiting example, without thereby departing from the scope of the invention as defined in the annexed claims.

The invention claimed is:

1. A method of detecting errors induced by noise pulses in a digital electronic circuit clocked by a first clock signal, the method comprising:
   providing a second clock signal offset in time of a given interval with respect to said first clock signal, each rising edge of the second clock signal preceding a subsequent rising edge of the first clock signal;
   performing, for at least one component of the digital electronic circuit, a correspondence check between two versions of a same signal in said digital electronic circuit, the correspondence check being clocked by the second clock signal;
   feeding each result of the correspondence check to a logic gate, the absence of correspondence between said two versions of said signal being indicative of an error induced in said digital electronic circuit by a noise pulse; and
   driving an output flip-flop with an output signal of the logic gate, the output flip-flop being clocked by an auxiliary clock signal, each rising edge of the auxiliary clock signal having a delay with respect to a preceding rising edge of the first clock signal;
   wherein the first clock signal clocks a first plurality of flip-flops of the digital electronic circuit, and the second clock signal clocks a second plurality of flip-flops of the digital electronic circuit.

2. The method of claim 1, wherein said second clock signal has the same period of said first clock signal.

3. The method of claim 1, including selectively varying the duration of said given interval to vary the resolution in detecting said errors induced by noise pulses.

4. The method of claim 1, including coupling to said at least one component a component providing redundancy for said at least one component, whereby said two versions of said signal are detected in said at least one component and said component, respectively.

5. The method of claim 1, including performing said correspondence check between two versions of the same signal as a correspondence check of the input signal and the output signal of said at least one component of the digital electronic circuit.

6. The method of claim 1, further comprising:
   coupling to at least one first component of the circuit a component providing redundancy for said at least one component, by detecting said two versions of said signal, in said at least one component and said component, respectively, and
   for said at least one second component of the circuit, performing said correspondence check between two versions of the same signal as a correspondence check of the input signal and the output signal of said at least one second component of the digital electronic circuit.

7. The method of claim 1, including performing said correspondence check as an XOR function of said two versions of the same signal.

8. The method of claim 1, including performing said correspondence check between two versions of the same signal for a plurality of components in said digital electronic circuit, feeding the results of said plurality of checks towards a logic sum function of said results, the result of said logic sum being representative of a possible error induced in said digital circuit by a noise pulse.

9. The method of claim 8, including latching the result of said logic sum with a signal selected out of said first clock signal, said second clock signal and an error latching signal.

10. The method of claim 1, including performing said correspondence check as an XNOR function of said two versions of the same signal.

11. The method of claim 10, including performing said correspondence check for a plurality of said components, feeding the results of said plurality of checks towards a logic product function, and using the result of said logic product for gating said clock signal and/or restarting the circuit after detecting an error.

12. The method of claim 1, including generating said first and second clock signals starting from a main clock signal subjected to corresponding delays.

13. The method of claim 1, wherein said first plurality of flip-flops and said second plurality of flip-flops each comprise a pipeline architecture.

14. The method of claim 13, wherein said first plurality of flip-flops and second plurality of flip-flops each further comprise a plurality of interconnecting circuits.

15. An electronic circuit comprising:
   a first plurality of flip-flops for receiving a first clock signal, an input signal, and for providing an output signal;
   a plurality of combinatorial circuits for interconnecting the first plurality of flip-flops;
   a second plurality of flip-flops for receiving a second clock signal and the input signal, each rising edge of the second clock signal preceding a subsequent rising edge of the first clock signal;
   a plurality of logic gates coupled to the first and second plurality of flip-flops; and
   a fault circuit for receiving an auxiliary clock signal and being coupled to outputs of the plurality of logic gates for providing a fault signal, each rising edge of the auxiliary clock signal having a delay with respect to a preceding rising edge of the first clock signal.

16. The electronic circuit of claim 15 wherein the first and second plurality of flip-flops each comprises a plurality of D-type flip-flops.

17. The electronic circuit of claim 15 wherein the first clock signal is delayed with respect to the second clock signal.

18. The electronic circuit of claim 15 wherein the plurality of logic gates comprises a plurality of XOR gates.

19. The electronic circuit of claim 15 wherein the fault circuit comprises an OR gate and a latch.

* * * * *